(12) United States Patent
Goden

(10) Patent No.: US 11,631,712 B2
(45) Date of Patent: Apr. 18, 2023

(54) PHOTOELECTRIC CONVERSION DEVICE, IMAGING SYSTEM, AND MOVING BODY WITH UPPER ELECTRODE AND CONDUCTIVE LAYER AT SAME POTENTIAL OR CONNECTED TO EACH OTHER

(71) Applicant: CANON KABUSHIKI KAISHA, Tokyo (JP)

(72) Inventor: Tatsuhito Goden, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 115 days.

(21) Appl. No.: 17/172,223

(22) Filed: Feb. 10, 2021

(65) Prior Publication Data

US 2021/0257399 A1    Aug. 19, 2021

(30) Foreign Application Priority Data

Feb. 19, 2020    (JP) .............................. JP2020-026133

(51) Int. Cl.
*H01L 27/146*    (2006.01)
*H04N 5/369*    (2011.01)

(52) U.S. Cl.
CPC .. *H01L 27/14636* (2013.01); *H01L 27/14621* (2013.01); *H01L 27/14623* (2013.01); *H01L 27/14625* (2013.01); *H04N 5/369* (2013.01)

(58) Field of Classification Search
CPC ......... H01L 27/14636; H01L 27/14621; H01L 27/14623; H01L 27/14625; H01L 27/14612; H01L 27/14627; H04N 5/369; H04N 5/3698
See application file for complete search history.

(56) References Cited

U.S. PATENT DOCUMENTS

| 9,774,810 B2 | 9/2017 | Tashiro et al. |
| 9,991,305 B2 | 6/2018 | Goden et al. |
| 10,652,496 B2 | 5/2020 | Goden et al. |
| 2010/0245641 A1 | 9/2010 | Takata |

(Continued)

FOREIGN PATENT DOCUMENTS

| JP | 2010-233096 A | 10/2010 |
| JP | 2012-114197 A | 6/2012 |
| JP | 2019-129322 A | 8/2019 |

OTHER PUBLICATIONS

U.S. Appl. No. 16/841,258, filed Apr. 6, 2020 (First Named Inventor: Tatsuhito Goden).

*Primary Examiner* — Gevell V Selby
(74) *Attorney, Agent, or Firm* — Venable LLP

(57) ABSTRACT

A photoelectric conversion device including an effective pixel region including a plurality of effective pixels and a peripheral region provided outside the effective pixel region, the photoelectric conversion device comprising: a wiring layer; an upper electrode; and a photoelectric conversion film provided extensively over the effective pixel region and the peripheral region, wherein each of the plurality of effective pixels includes a pixel electrode disposed between the wiring layer and the photoelectric conversion film in a depth direction, the peripheral region includes a conductive layer disposed between the wiring layer and the photoelectric conversion film in the depth direction, and the upper electrode and the conductive layer are at a same potential.

17 Claims, 21 Drawing Sheets

(56) References Cited

U.S. PATENT DOCUMENTS

| | | |
|---|---|---|
| 2017/0212221 A1 | 7/2017 | Goden et al. |
| 2018/0372539 A1 | 12/2018 | Goden |
| 2019/0214417 A1* | 7/2019 | Matsuo .................. H04N 5/374 |
| 2019/0229150 A1 | 7/2019 | Isono et al. |
| 2020/0076999 A1* | 3/2020 | Akiyama ............. H04N 5/2254 |
| 2020/0295196 A1* | 9/2020 | Asami ............... H01L 29/78696 |
| 2021/0366961 A1* | 11/2021 | Yanagita ........... H01L 27/14627 |

* cited by examiner

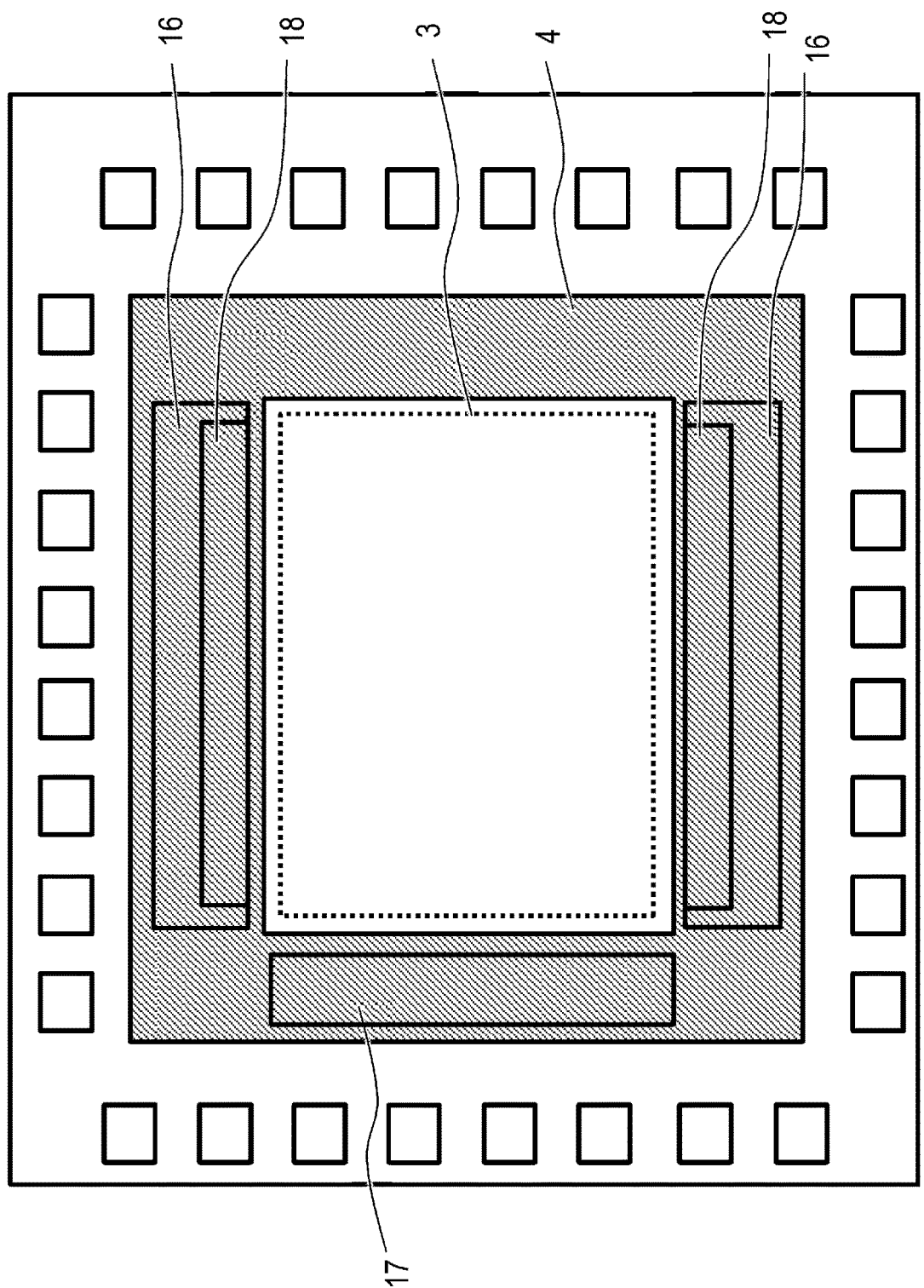

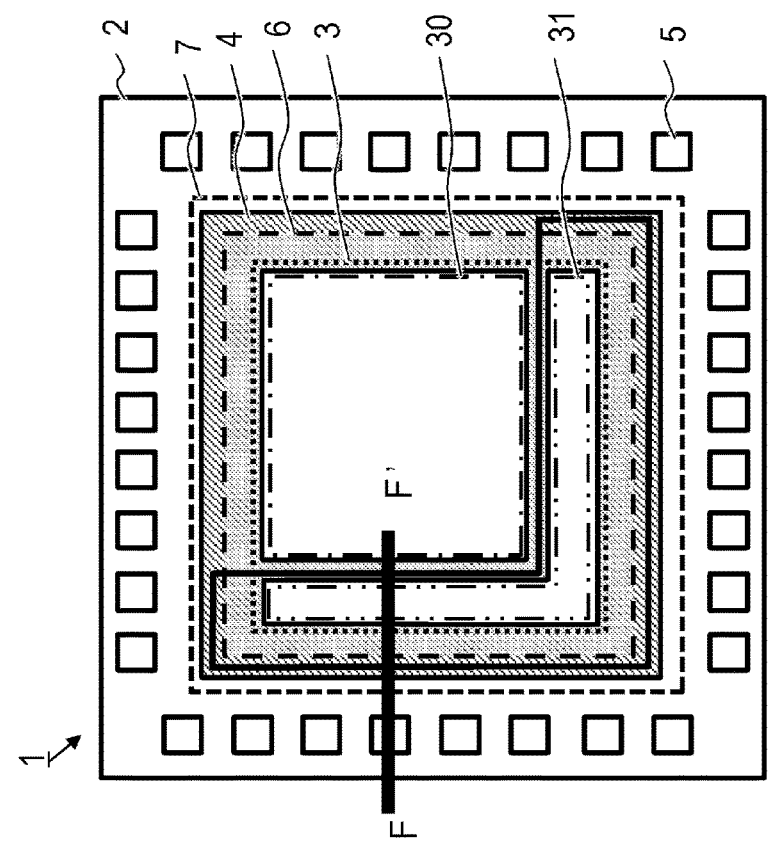
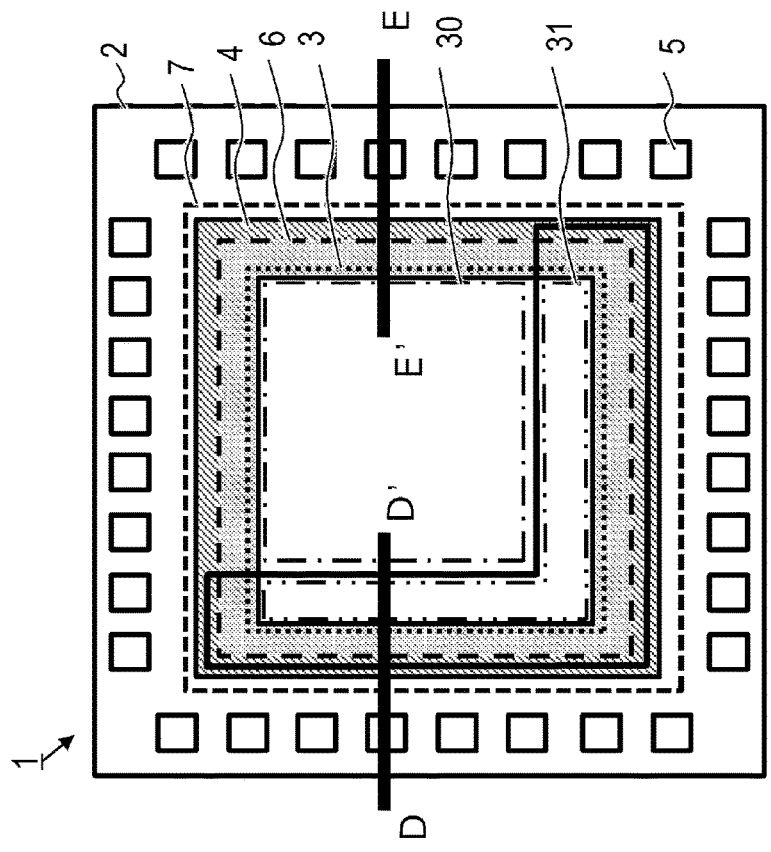

PHOTOELECTRIC CONVERSION DEVICE, IMAGING SYSTEM, AND MOVING BODY WITH UPPER ELECTRODE AND CONDUCTIVE LAYER AT SAME POTENTIAL OR CONNECTED TO EACH OTHER

BACKGROUND OF THE INVENTION

Field of the Invention

The present invention relates to a photoelectric conversion device, an imaging device, and a moving body.

Description of the Related Art

Conventionally, as a configuration of an imaging device (photoelectric conversion device), a configuration is known, in which a photoelectric conversion film is laminated on a substrate and which includes pixels each including a light receiving portion.

In an imaging device described in Japanese Patent Application Publication No. 2012-114197, a photoelectric conversion film is formed over a pixel region and a peripheral region extending from the pixel region (region around the pixel region). Over the photoelectric conversion film in the peripheral region, an upper electrode is formed to extend from the pixel region. Also, in the peripheral region, wiring made of metal is disposed, and the photoelectric conversion film covering the wiring from above and the wiring come into contact and are electrically connected with each other. At this time, the wiring is connected at a voltage higher than that of the upper electrode.

In Japanese Patent Application Publication No. 2012-114197, in the peripheral region in the imaging device described, even when incident light is converted to charges in the photoelectric conversion film, the charges are attracted by an electric field to the wiring and are released to an outside via the wiring. This can reduce a possibility of entrance of the charges, which have been generated in the peripheral region, into the pixel region (mix in charges in the pixel region), resulting in affecting pixel signals, and thus can prevent image quality degradation.

However, in an imaging device (photoelectric conversion device) as described above, wiring is connected at a potential (voltage) higher than that of an upper electrode. As a result, when, for example, a defect present in the photoelectric conversion film causes a short circuit between the wiring and the upper electrode, heat generated by an overcurrent may affect the imaging device (photoelectric conversion device) to result in a breakdown thereof.

SUMMARY OF THE INVENTION

An object of the present technique is to prevent image quality degradation and reducing a possibility of a breakdown of a photoelectric conversion device.

A aspect of the present technique is: a photoelectric conversion device including an effective pixel region including a plurality of effective pixels and a peripheral region provided outside the effective pixel region, the photoelectric conversion device comprising: a wiring layer; an upper electrode; and a photoelectric conversion film provided extensively over the effective pixel region and the peripheral region, wherein each of the plurality of effective pixels includes a pixel electrode disposed between the wiring layer and the photoelectric conversion film in a depth direction, the peripheral region includes a conductive layer disposed between the wiring layer and the photoelectric conversion film in the depth direction, and the upper electrode and the conductive layer are at a same potential.

Further features of the present invention will become apparent from the following description of exemplary embodiments with reference to the attached drawings.

BRIEF DESCRIPTION OF THE DRAWINGS

FIG. 6 is a plan view illustrating a conductive layer and a peripheral circuit each according to the first embodiment;

FIG. 14A is a plan view of an imaging device according to a fourth embodiment;

FIG. 14B is a plan view of an imaging device according to a fifth embodiment;

DESCRIPTION OF THE EMBODIMENTS

Figure 1:
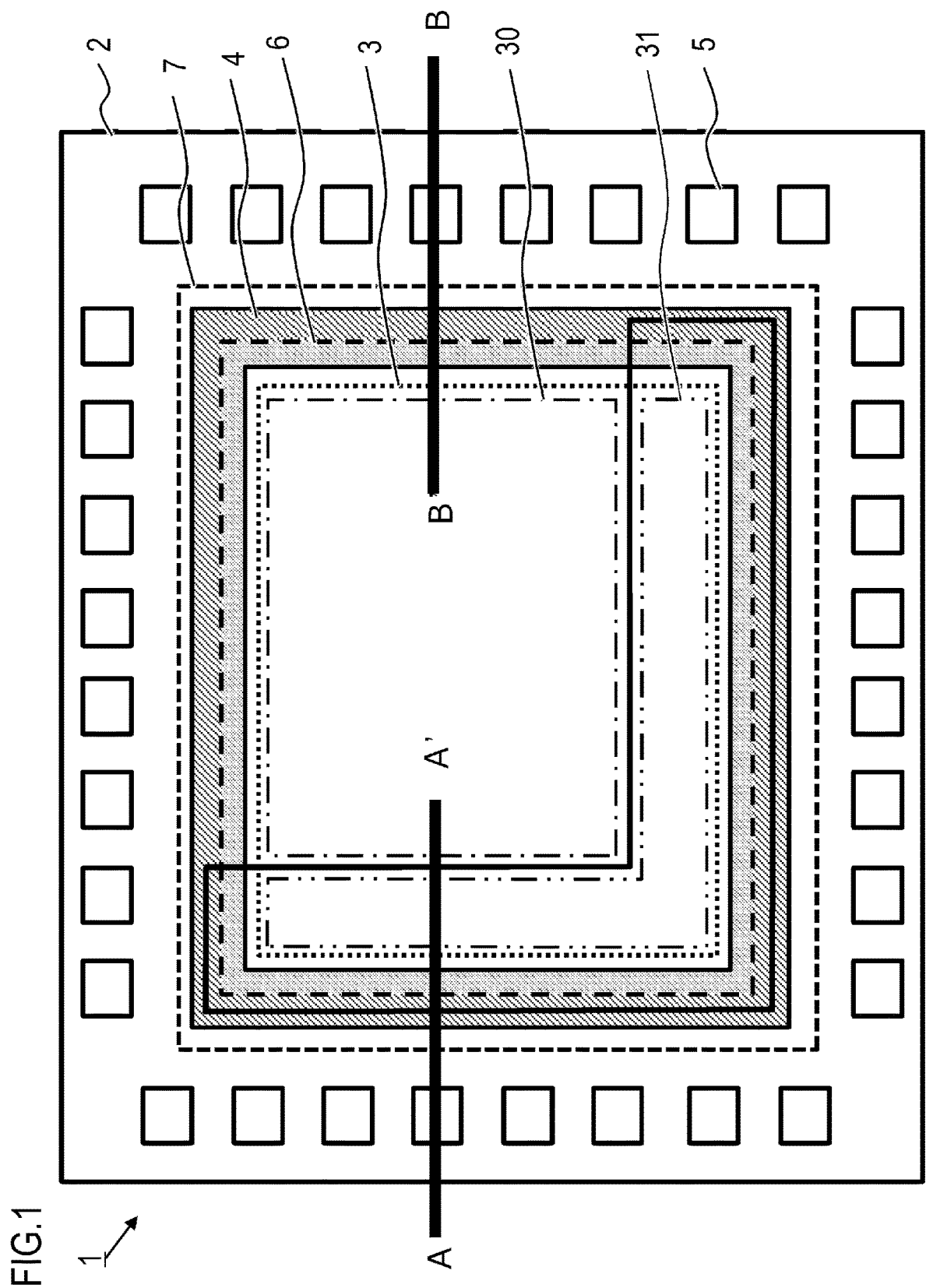
FIG. 1 is a plan view of an imaging device according to a first embodiment.

Referring to the drawings, the following will describe embodiments according to our technique. Note that the individual embodiments mentioned above can randomly be combined unless a contradiction occurs.

First Embodiment

A description will be given below of a configuration of an imaging device 1 (photoelectric conversion device) according to the first embodiment. According to the first embodiment, it is possible to prevent image quality degradation and also reduce a possibility of a breakdown of the imaging device 1.

Configuration of Imaging Device

Figure 2:
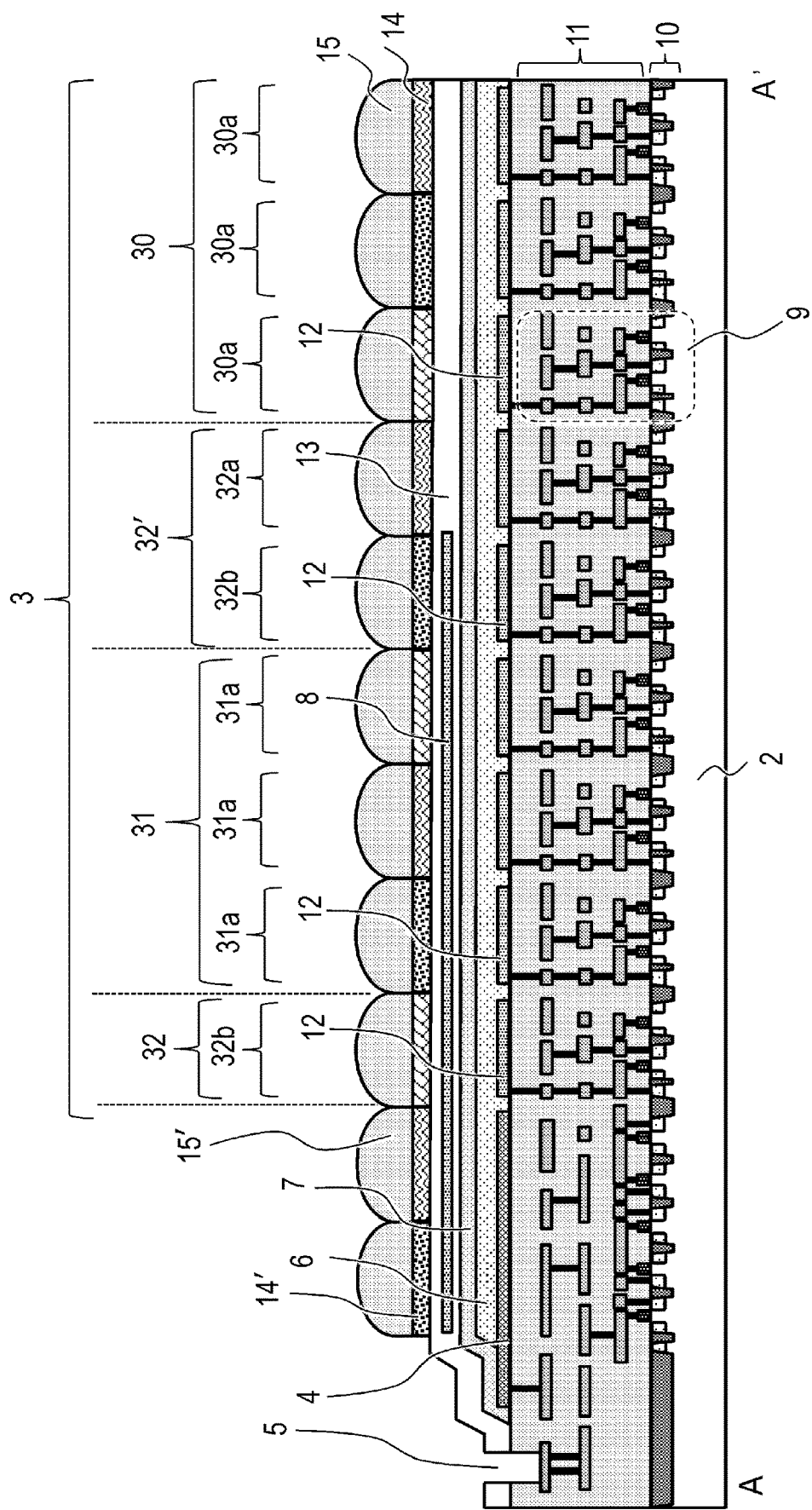
FIG. 2 is a cross-sectional view of the imaging device according to the first embodiment along a line A-A'.

FIG. 1 is a plan view obtained by viewing the imaging device 1 from above (viewing the imaging device 1 in plan view). FIG. 2 is a cross-sectional view of the imaging device 1 illustrated in FIG. 1 along a line A-A'. The imaging device 1 includes a semiconductor substrate 2, a pixel region 3, a conductive layer 4, pads 5, a photoelectric conversion film 6, and an upper electrode 7. In the first embodiment, "upper (over)" is a direction in which the upper electrode 7 is located relative to the photoelectric conversion film 6 and in which the individual components of the imaging device 1 are stacked (depth direction).

In the semiconductor substrate 2, circuits and wiring (not shown) for reading signals from individual pixels are provided. The pixel region 3 is located over the semiconductor substrate 2. A detailed configuration of the pixel region 3 will be described later.

The conductive layer 4 is disposed over the semiconductor substrate 2 (a wiring layer 11 described later) so as to surround the pixel region 3. As illustrated in FIG. 2, in a peripheral region (region around the pixel region 3 or outside the pixel region 3), an area where the photoelectric conversion film 6 is interposed between the conductive layer 4 and the upper electrode 7 is present.

The plurality of pads 5 are arranged so as to surround the conductive layer 4 in plan view. The pads 5 connect the circuits and the wiring each provided in the peripheral region to an outside thereof by wire bonding. Some of the plurality of pads 5 are the pads to which a bias is supplied from outside the photoelectric conversion device.

The photoelectric conversion film 6 performs photoelectric conversion of light incident on the photoelectric conversion film 6 to charges. It is sufficient that at least a portion of the photoelectric conversion film 6 can perform the photoelectric conversion. The photoelectric conversion can be implemented by a photoelectric conversion portion such as, e.g., a photodiode. The photoelectric conversion film 6 has a region extending (continuously) over the conductive layer 4 and in the pixel region 3 and stacked on the conductive layer 4. Note that, by calculating a difference between a signal acquired through the photoelectric conversion performed by the photoelectric conversion film 6 in a light blocking pixel (OB pixel) and a signal (image signal) acquired through the photoelectric conversion performed by the photoelectric conversion film 6 in an effective pixel, compensation processing of removing a DC component from a dark current can be performed.

Note that, in a process of manufacturing the photoelectric conversion film 6, the photoelectric conversion film 6 is deposited over an entire surface of the semiconductor substrate 2 and then patterned in an intended region. At this time, an edge portion (end portion) of the photoelectric conversion film 6 may be damaged by the patterning to undergo characteristic fluctuations. To prevent the characteristic fluctuations, the photoelectric conversion film 6 is caused to extend also in the peripheral region (outside the pixel region 3). This can keep the edge portion (end portion) of the photoelectric conversion film 6 apart from the pixel region 3 and therefore form the undamaged photoelectric conversion film 6 having an excellent characteristic to be formed in the pixel region 3 in the manufacturing process.

The upper electrode 7 is a conductive member and transmits light. The upper electrode 7 is stacked on the photoelectric conversion film 6. As illustrated in FIG. 2, in the peripheral region (outside the pixel region), the upper electrode 7 has a region which is not in contact with the photoelectric conversion film 6 and, in this region, the upper electrode 7 is in contact with the conductive layer 4. Thus, the upper electrode 7 and the conductive layer 4 are electrically connected. In the first embodiment, along four sides of the conductive layer 4 in the form of a rectangular frame, the conductive layer 4 and the upper electrode 7 are electrically connected.

Configuration of Pixel Region

Referring to FIG. 2, a description will be given of the detailed configuration of the pixel region 3. The pixel region 3 includes pixel circuits 9, pixel electrodes 12, the photoelectric conversion film 6, the upper electrode 7, a protective film 13, color filters 14, and microlenses 15.

The pixel circuits 9 are circuits respectively disposed for the individual pixels. The pixel circuits 9 read signals based on charges generated in the photoelectric conversion film 6. Each of the pixel circuits 9 has a transistor layer 10 including an amplification transistor, a reset transistor, a selection transistor, a charge storage portion, and the like. The pixel circuit 9 also has, over the transistor layer 10, the wiring layer 11 including a plurality of insulating films and wiring.

The pixel electrodes 12 separate the charges generated in the photoelectric conversion film 6 on a per pixel basis and collect the charges. The pixel electrodes 12 are disposed on the wiring layer 11 (between the wiring layer 11 and the photoelectric conversion film 6) on a per pixel basis. The photoelectric conversion film 6 is disposed so as to cover the pixel electrodes 12 in the pixel region 3 in plan view. The upper electrode 7 is disposed on the photoelectric conversion film 6 in the pixel region 3. In other words, in the pixel region 3, the photoelectric conversion film 6 is disposed between the upper electrode 7 and the pixel electrodes 12. The protective film 13 is disposed over the upper electrode 7.

Each of the color filters 14 is a filter which transmits any of light beams R, G, and B or any of light beams C, M, and Y. The color filters 14 and the microlenses 15 are provided on the protective film 13.

Arrangement of Pixels

The pixel region 3 includes an effective pixel region 30, a light blocking pixel region 31 (optical black pixel region), a dummy pixel region 32, and a dummy pixel region 32'. For example, in a center portion of the pixel region 3, the effective pixel region 30 is disposed while, in a peripheral portion of the pixel region 3, the light blocking pixel region 31 where the light blocking film 8 is disposed is disposed. Note that, to perform signal compensation for the pixels arranged in two dimensions, as illustrated in FIG. 1, the light blocking pixel region 31 is preferably disposed along two sides of the pixel region 3 perpendicular to each other.

The effective pixel region 30 is the pixel region where light is incident on the photoelectric conversion film 6. The effective pixel region 30 has effective pixels 30a each not including the light blocking film 8. In addition, a signal acquired through the photoelectric conversion by the photoelectric conversion film 6 in each of the effective pixels 30a is handled as an image signal resulting from imaging of a subject to be imaged.

The light blocking pixel region 31 (OB pixel region) is the pixel region where light directed to the photoelectric conversion film 6 is blocked by the light blocking film 8. The light blocking pixel region 31 has light blocking pixels 31a (OB pixels) in each of which the light blocking film 8 is disposed over the upper electrode 7. Each of the light blocking pixels 31a has the same configuration as that of each of the effective pixels 30a except that the light blocking film 8 is included therein. In addition, a signal acquired through the photoelectric conversion by the photoelectric conversion film 6 in the light blocking pixels 31a is used for the compensation processing of removing the DC component of the dark current from the image signal.

The dummy pixel region 32 is disposed at an end portion of the pixel region 3 to be adjacent to the light blocking pixel region 31. The dummy pixel region 32 has dummy light blocking pixels 32b. The dummy pixel region 32' is disposed between the effective pixel region 30 and the light blocking pixel region 31. The dummy pixel region 32' has dummy pixels 32a and the dummy light blocking pixels 32b.

The dummy pixels 32a are disposed adjacent to the effective pixel region 30. The dummy light blocking pixels 32b are disposed adjacent to the light blocking pixel region 31. In other words, the dummy pixels 32a are arranged so as to surround the effective pixel region 30. The dummy light blocking pixels 32b are arranged so as to surround the light blocking pixel region 31. Each of the dummy pixels 32a has the same configuration as that of each of the effective pixels 30a. Each of the dummy light blocking pixels 32b has the same configuration as that of each of the light blocking pixels 31a.

Note that a signal acquired by the photoelectric conversion film 6 in the dummy pixel 32a is not handled as the image signal. A signal acquired by the photoelectric conversion film 6 in the dummy light blocking pixel 31b is not used for the compensation processing of removing the DC component of the dark current. In addition, each of the effective pixels 30a, the light blocking pixels 31a, the dummy pixels 32a, and the dummy light blocking pixels 32b has the pixel electrode 12, and the pixel electrode 12 and the pixel circuit 9 are electrically connected.

Thus, the dummy pixels 32a each not having the light blocking film 8 surround the effective pixels 30a to result in a structure in which the dummy pixels 32a are arranged around the effective pixels 30a. This can prevent characteristic fluctuations resulting from a layout. Specifically, even when the position of the light blocking film 8 is displaced due to manufacturing variations, the presence of the dummy pixel region 32' (dummy pixels 32a) between the effective pixel region 30 and the light blocking pixel region 31 allows incident light to reach the photoelectric conversion film 6 of each of the effective pixels 30a.

In addition, since the dummy light blocking pixels 32b each having the light blocking film 8 surround the light blocking pixels 31a, in spite of the entrance of the incident light from an end portion of the light blocking film 8, the incident light does not enter the photoelectric conversion film 6 of each of the light blocking pixels 31a. In other words, it is possible to reduce a possibility that light is incident on the photoelectric conversion film 6 of each of the light blocking pixels 31a.

In the example in FIG. 2, the dummy pixels 32a surrounding the effective pixel region 30 and the dummy light blocking pixels 31b surrounding the light blocking pixel region 31 are equivalent to one pixel, but the dummy pixels 32a and the dummy light blocking pixels 31b which are at least two pixels may also be provided.

Figure 3:
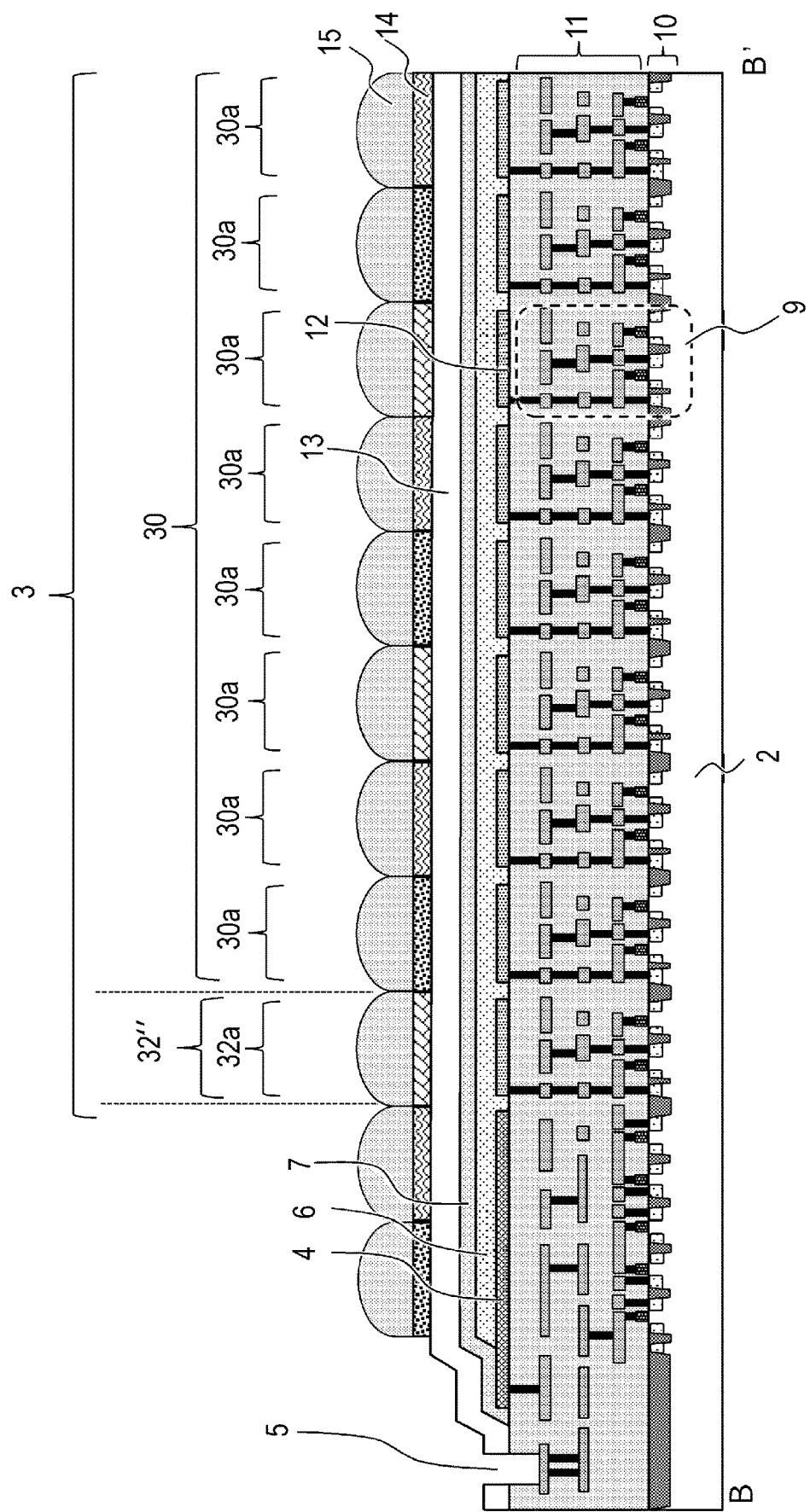
FIG. 3 is a cross-sectional view of the imaging device according to the first embodiment along a line B-B.

FIG. 3 is a cross-sectional view of the imaging device 1 illustrated in FIG. 1 along a line B-B'. Unlike in FIG. 2, in the cross section, the light blocking pixel region 31 is not disposed. At an end portion of the pixel region 3, a dummy pixel region 32" is disposed adjacent to the effective pixel region 30. Here, the dummy pixel region 32" surrounds the effective pixel region 30. The dummy pixel region 32" has the dummy pixels 32a. In the same manner as in the case illustrated in FIG. 2, this allows a sufficient amount of incident light to reach the photoelectric conversion film 6 of each of the effective pixels 30a.

Figure 4A:
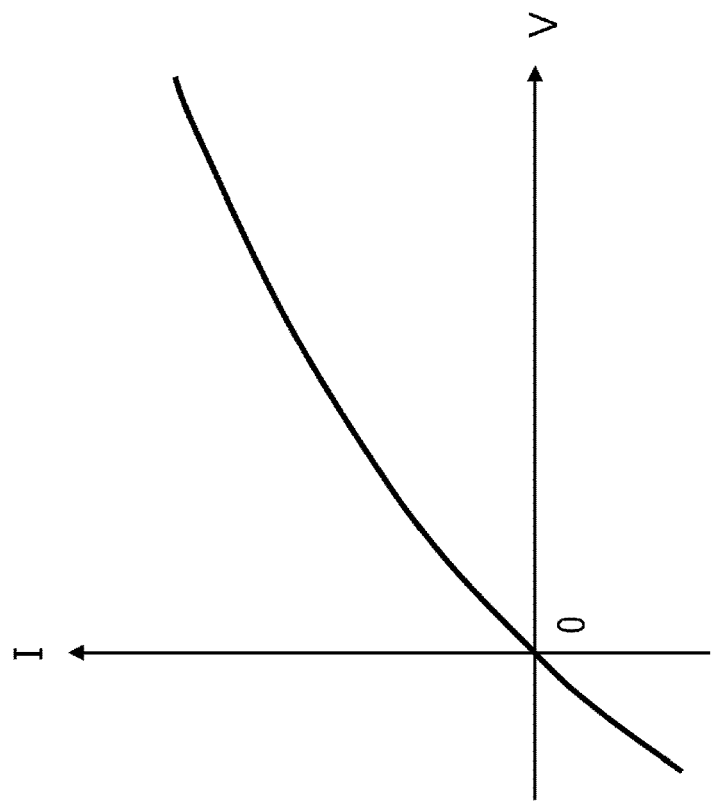
FIG. 4A is a diagram illustrating a relationship between an applied voltage and a photocurrent.

FIG. 4A illustrates a relationship between an applied voltage V and a photocurrent I in the photoelectric conversion film 6 when a given amount of light is incident thereon. When the applied voltage is zero, the current flowing in the photoelectric conversion film 6 is substantially zero. This is because, even when electrons are generated, since an electric field is zero, the electrons are immediately recombined with holes.

In the first embodiment, the conductive layer 4 and the upper electrodes 7 are in contact with each other, and accordingly the applied voltage is zero in a region of the photoelectric conversion film 6 which is interposed between the conductive layer 4 and the upper electrode 7. Consequently, a current generated in the region of the photoelectric conversion film 6 is substantially zero. In other words, charges are prevented from moving from the photoelectric conversion film 6 over the conductive layer 4 into the pixel region 3, and therefore the image quality degradation can be prevented. In addition, in this configuration, even when the potential of the upper electrode 7 is changed during the operation of the imaging device 1, the potential of the conductive layer 4 also changes similarly to the potential of the upper electrode 7, and the voltage applied to the photoelectric conversion film 6 is held at zero. This allows the effect of preventing the image quality degradation to be obtained.

Figure 5:
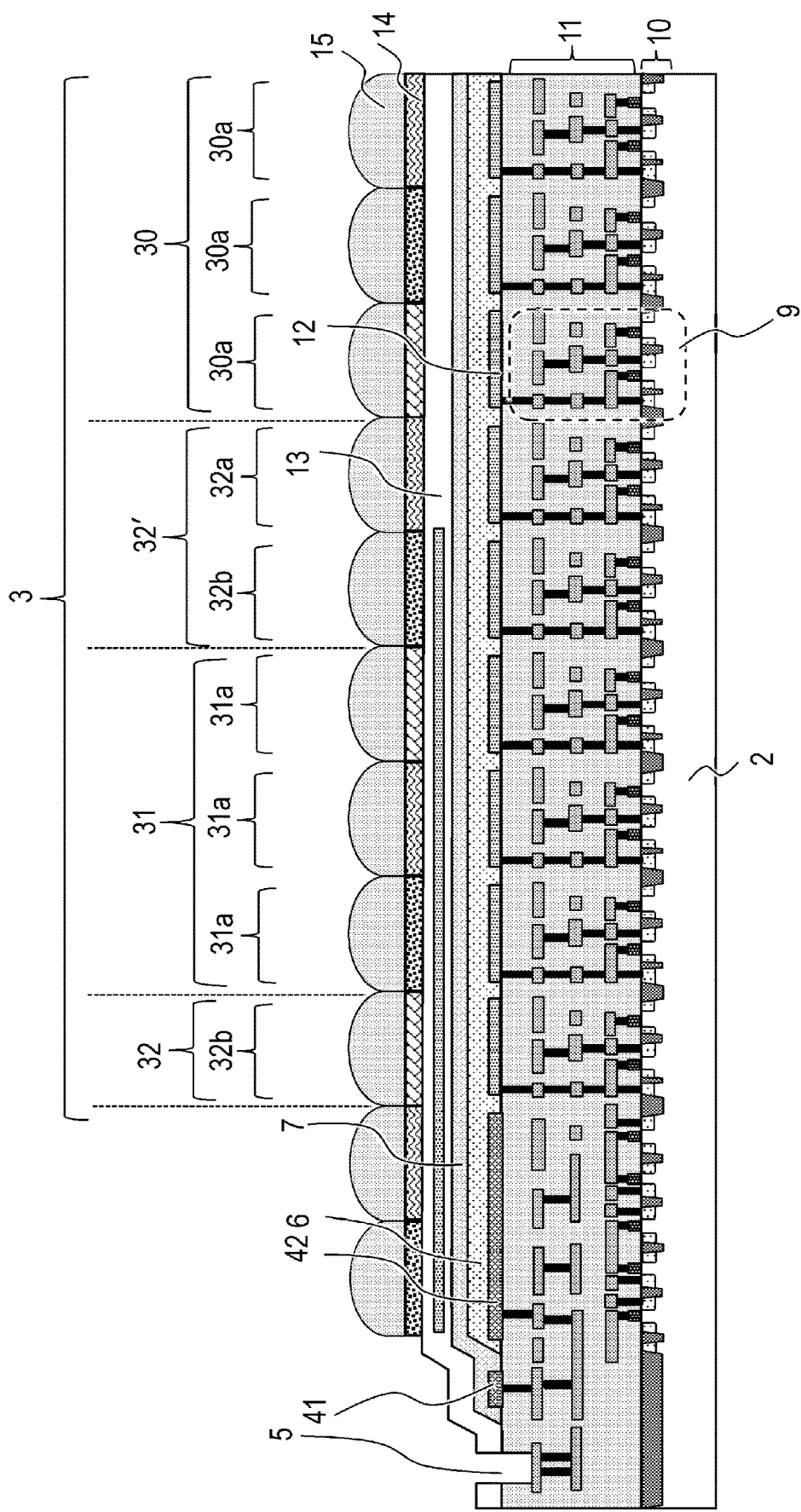
FIG. 5 is a cross-sectional view of another imaging device according to the first embodiment.

Also, in the configuration of the first embodiment, the conductive layer 4 and the upper electrode 7 are in contact with each other, but it is sufficient that the conductive layer 4 and the upper electrode 7 are at the same potential. For example, instead of a configuration as illustrated in the cross-sectional view of FIG. 2, a configuration as illustrated in the cross-sectional view of FIG. 5 may also be used. Specifically, the configuration may also be such that the conductive layer 4 includes a first portion 41 in contact with the upper electrode 7 and a second portion 42 not in contact with the upper electrode 7, and the first portion 41 and the second portion 42 are electrically connected by the wire in the wiring layer 11. In other words, the conductive layer 4 and the upper electrode 7 may also be electrically connected to each other via the wiring layer 11. It may also be possible to use a configuration in which, even when the conductive layer 4 and the upper electrode 7 are not electrically connected, the first portion 41 and the second portion 42 are respectively connected to the different pads 5, and voltages each having the same value are input to the first portion 41 and the second portion 42 from an external power source.

When the conductive layer 4 and the upper electrode 7 are at the same potential, even if, e.g., the photoelectric conversion film 6 has a defect and aging degradation causes a short circuit therein, no current flows. This reduces a possibility of heat generation or breakdown due to heat, and therefore the reliability of the imaging device 1 is less likely to be degraded.

In addition, each of the conductive layer 4 and the pixel electrode 12 is disposed between the wiring layer 11 and the photoelectric conversion film 6 and on the wiring layer 11 (on the wiring layer). By thus disposing the conductive layer 4 in the same layer (at the same stacking position) as that of the pixel electrode 12, it is possible to reduce a level difference in the substrate which is produced when the upper electrode 7 is deposited. Therefore, it is possible to prevent an increased resistance of the upper electrode 7 and step disconnection and prevent unevenness in an imaged image. In addition, since the pixel electrode 12 and the conductive layer 4 are disposed in the same layer, it is possible to easily form the pixel electrodes 12 and the conductive layer 4 in the same process steps.

Conductive Layer

FIG. 6 is an example of a plan view illustrating the conductive layer 4 and a peripheral region (region around the pixel region 3) in the first embodiment.

In the peripheral region, peripheral circuits formed of transistors, such as a column signal processing circuit 16, a row control circuit 17, and column amplifier circuits 18, are disposed, and the wiring layer 11 including the plurality of insulating films and the wiring is disposed thereover. The peripheral circuits are disposed on a side of the wiring layer 11 (on a lower side of the wiring layer 11) opposite to a side thereof on which the conductive layer 4 is present.

The conductive layer 4 is disposed so as to cover at least some of the peripheral circuits such as the column signal processing circuit 16 and the row control circuit 17 in plan view. In addition, the conductive layer 4 is disposed over the wiring layer 11. Note that, to prevent an erroneous operation of the peripheral circuits, it is required to prevent light from being incident on the peripheral circuits. However, the conductive layer 4 thus disposed so as to block the light incident on the peripheral circuits eliminates the need for the wiring layer 11 to block the light incident on the peripheral circuits. This increases flexibility of a layout of the wiring layer 11 and can reduce a size of the imaging device 1. Note that it is necessary to block light directed to the column signal processing circuit 16, especially the column amplifier circuits 18, among the peripheral circuits.

The column amplifier circuits 18 amplify a signal voltage from the pixel circuit 9 at a ratio between respective sizes of two capacitors. The column amplifier circuits 18 also have the function of changing an amplification factor by performing switching between the capacitors by using a switch.

Column Amplifier Circuit

Figure 4B:
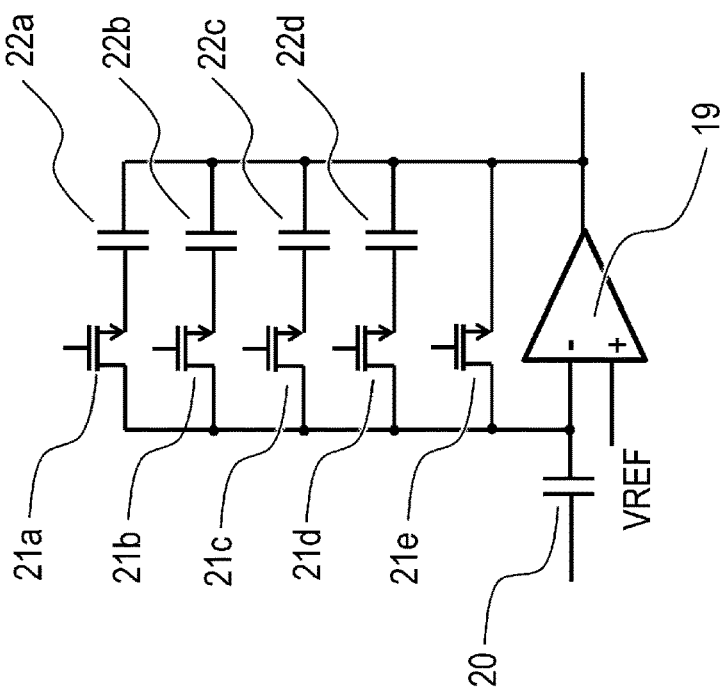
FIG. 4B is a configuration diagram of a column amplifier circuit.

FIG. 4B illustrates an example of a configuration of each of the column amplifier circuits 18. The column amplifier circuit 18 includes an operational amplifier 19. To a negative input terminal of the operational amplifier 19, one terminal of a capacitor 20 is connected. Note that, to the other terminal of the capacitor 20, signals are input from the pixels. To the negative input terminal of the operational amplifier 19, respective one terminals of transistor switches 21a, 21b, 21c, and 21d are also connected.

To the other terminals of the transistor switches 21a to 21d, respective one terminals of capacitors 22a to 22d are connected. The other terminals of the capacitors 22a to 22d and the other terminal of the transistor switch 21e are connected to an output terminal of the operational amplifier 19. To a positive input terminal of the operational amplifier 19, a reference voltage VREF is supplied.

Before the column amplifier circuit 18 is driven, the transistor switch 21e is turned ON to cause a short circuit between the negative input terminal of the operational amplifier 19 and the output terminal thereof and thus reset (initialize) charges stored in the capacitors 22a to 22d. Through turning ON of any of the transistor switches 21a to 21d, any of the capacitors 22a to 22d is electrically connected to the operational amplifier 19 to allow the amplification factor of the column amplifier circuit 18 to be changed.

Note that, to cause amplification, it is necessary for the capacitors 22a to 22d to hold signal voltages but, when light is incident on the column amplifier circuit 18, leakage currents due to the light are generated in the transistor switches 21a to 21d. By contrast, by causing the conductive layer 4 to block the light as in the first embodiment, it is possible to prevent the leakage currents due to the light in the transistor switches 21a to 21d and prevent fluctuations in amplification factor due to the capacitors 22a to 22d.

In addition, by causing the conductive layer 4 to cover the peripheral circuits, it is possible to prevent a manufacturing process damage during patterning in the process of manufacturing the photoelectric conversion film 6 from being exerted on the peripheral circuits. Note that, since the conductive layer 4 can be formed of the same material (raw material) as that of the pixel electrodes 12 and by the same process steps as those used to form the pixel electrodes 12, the conductive layer 4 can easily be formed. To prevent light from being incident on the peripheral circuits such as the column amplifier circuits 18, the light blocking film 8 disposed in the light blocking pixel region 31 may also be disposed to extend over the conductive layer 4 in the peripheral region.

Pixel Circuit

A description will be given below of each of the pixel circuits 9 in the first embodiment.

Figure 7A:
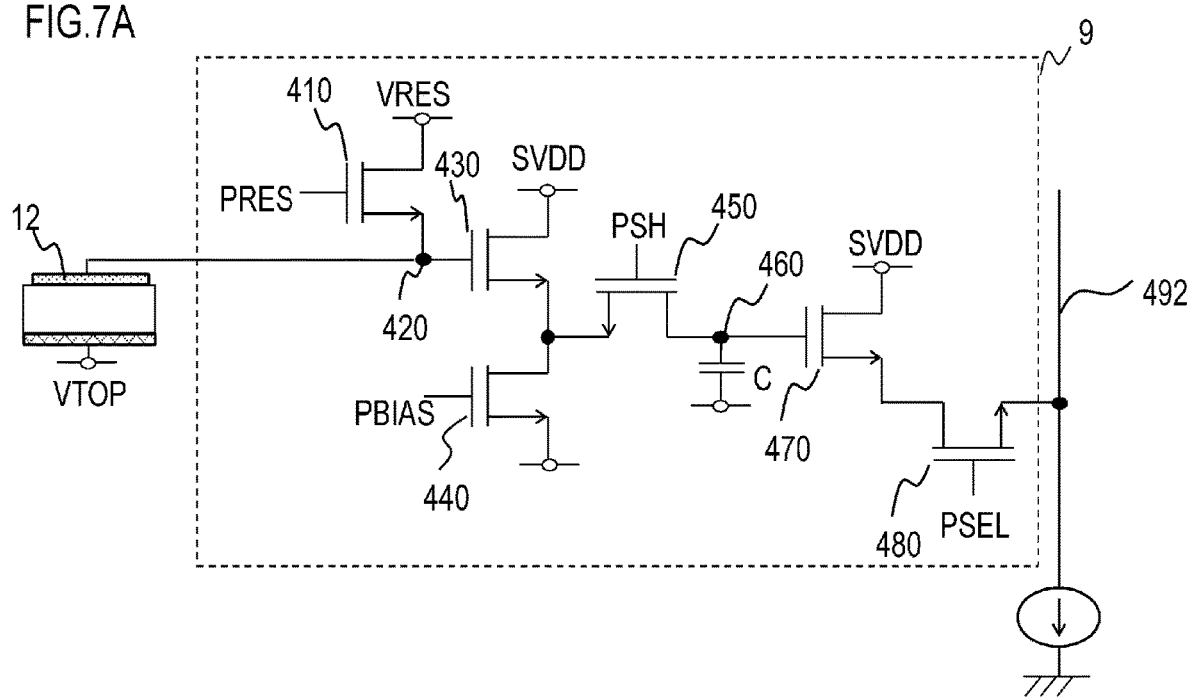
FIG. 7A is an equivalent circuit diagram of a pixel circuit according to the first embodiment.

FIG. 7A illustrates an equivalent circuit diagram of each of the pixel circuits 9 provided to correspond to the individual pixel electrodes 12. Each of the pixel electrodes 12 is connected to a gate of a first amplification transistor 430 via a first floating diffusion (FD) 420. The FD 420 is configured to allow a reset potential VRES to be written therein via a reset transistor 410. A source of the first amplification transistor 430 is connected to a ground potential via a transistor 440. A drain of the first amplification transistor 430 is connected to a reference potential SVDD. A source of the first amplification transistor 430 is connected to a gate of a second amplification transistor 470 via a transistor 450 and a second FD 460. A drain of the second amplification transistor 470 is connected to the reference potential SVDD. A source of the second amplification transistor 470 is connected to an output line 492 via a selection transistor 480. To the second FD 460, a retention capacitor C is connected.

In FIG. 7A, PSEL represents a potential to be input to a gate of the selection transistor 480, PBIAS represents a potential to be input to a gate of the transistor 440, PRES represents a potential to be input to a gate of the reset transistor 410, and PSH represents a potential to be input to a gate of the transistor 450.

Figure 7B:
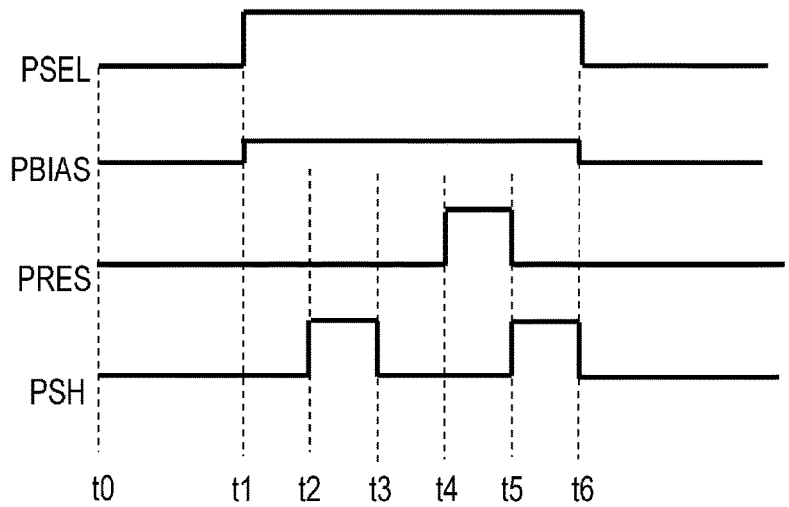
FIG. 7B is a diagram illustrating driving according to the first embodiment.

Referring to FIG. 7B, a description will be given of driving of the pixel circuit in FIG. 7A. A time t0 is any given time at which charge storage is initiated. At a time t1, each of the PSEL and the PBIAS is shifted from a Low level (L level) to a High level (H level) to turn ON the selection transistor 480 and the transistor 440. As a result, a noise level potential (N signal) as a potential corresponding to the second FD 460 is output to the output line 492 via the second amplification transistor 470 and the selection transistor 480. To cause the transistor 440 to operate as a current source, the PBIAS is set at the H level so as to provide an intended current value.

Then, at a time t2, the PSH is shifted from the L level to the H level to turn ON the transistor 450. Then, at a time t3, the PSH is shifted from the H level to the L level to turn OFF the transistor 450. By such driving, a signal level potential corresponding to charges stored in the first FD 420 is transferred to the second FD 460, and the signal level potential (S signal) as the potential corresponding to the second FD 460 is output to the output line 492.

Then, at t4, the PRES is shifted from the L level to the H level to turn ON the reset transistor 410. As a result, in the first FD 420, the reset potential VRES is written.

Then, at a time t5, the PRES is shifted from the H level to the L level to turn OFF the reset transistor, and the PSH is shifted from the L level to the H level to turn ON the transistor 450. As a result, the noise level potential as a potential corresponding to the first FD 420 is transferred to the second FD 460. The noise level potential is retained in the retention capacitor C.

Finally, at a time t6, each of the PRES, the PBIAS, and the PSH is shifted from the H level to the L level to turn OFF the reset transistor 410, the transistor 440, and the transistor 450. As a result, the charge storage is resumed. During the charge storage, the capacitor C retains the noise level potential.

Note that, in FIG. 7A, the pixel circuit having the two amplification transistors is illustrated. However, the pixel circuit need not necessarily include the two amplification transistors, and the pixel circuit including one amplification transistor may also be used.

Member of Each Component

Next, a description will be given of a member (material) of each of the components of the imaging device 1.

For the insulating films in the wiring layer 11, for example, silicon dioxide, BPSG, PSG, BSG, silicon nitride, or silicon carbide can be used. For the wiring in the wiring layer 11, a conductive material such as copper, aluminum, tungsten, tantalum, titanium, or polysilicon can be used.

The pixel electrodes 12 are thin-film electrodes. Each of the pixel electrodes 12 is formed of a transparent or opaque conductive member such as, e.g. ITO or aluminum.

The upper electrode 7 is formed of a conductive member having a high light transmissivity. Examples of the conductive member having the high light transmissivity include a compound containing indium or tin such as ITO (Indium Tin Oxide), a compound such as ZnO, and the like. Such a configuration allows a large amount of light to be incident on the photoelectric conversion film 6 and allows a sensitivity of the photoelectric conversion film 6 to be improved. Note that polysilicon or metal formed thin to be able to transmit light may also be used as the upper electrode 7. Since metal has a low electric resistance, when metal is used as a material of the upper electrode 7, it is possible to achieve lower power consumption and a higher speed.

The photoelectric conversion film 6 may be formed of a semiconductor material such as genuine amorphous silicon (hereinafter referred to as a-Si), low-concentration P-type a-Si, or low-concentration N-type a-Si. Alternatively, the photoelectric conversion film 6 may also be formed of a compound semiconductor material. For example, the photoelectric conversion film 6 is formed of a group III-V compound semiconductor such as BN, GaAs, GaP, AlSb, or GaAlAsP, a group II-VI compound semiconductor such as CdSe, ZnS, or HdTe, or a group IV-VI compound semiconductor such as PbS, PbTe, or CuO. Still alternatively, the photoelectric conversion film 6 may also be formed of an organic semiconductor material. For example, as the organic semiconductor material, fullerene, coumarin 6 (C6), rhodamine 6G (R6G), zinc phthalocyanine (ZnPc), quinacridone, a phthalocyanine-based compound, a naphthalocyanine-based compound, or the like can be used. In addition, a layer containing quantum dots formed of any of the semiconductor materials described above can be used for the photoelectric conversion film 6. At this time, the quantum dots are preferably particles having particle diameters not more than 20.0 nm.

Note that, when the photoelectric conversion film 6 is formed of a semiconductor material, the semiconductor material is preferably a material doped with a low-concentration impurity or a genuine semiconductor. Such a configuration allows a depletion layer in the photoelectric conversion film 6 to be sufficiently widened, and therefore it is possible to obtain effects such as increasing sensitivity and reducing noise.

Figure 8:
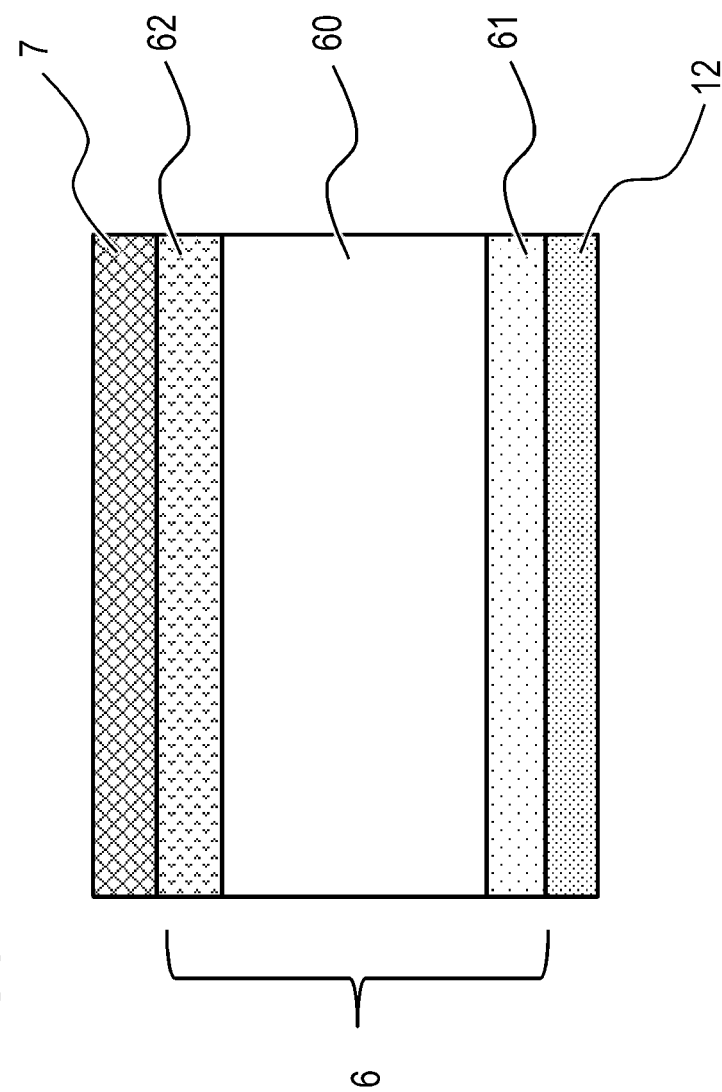
FIG. 8 is a diagram illustrating an example of a configuration of a photoelectric conversion film according to the first embodiment.

FIG. 8 illustrates an example illustrating a configuration of the photoelectric conversion film 6. The photoelectric conversion film 6 is allowed to have, in addition to a photoelectric conversion layer 60, a first functional layer 61 which prevents charges from being injected from the pixel electrode 12 into the photoelectric conversion layer 60, such as, e.g., a charge blocking layer or an adhesion layer, between the photoelectric conversion layer 60 and the pixel electrode 12. The photoelectric conversion film 6 is also allowed to have, between the photoelectric conversion layer 60 and the upper electrode 7, a second functional layer 62 which prevents charges from being injected from the upper electrode 7 into the photoelectric conversion layer 60, such as a charge blocking layer.

The pixel electrode 12 is formed of a conductive member such as metal. For the pixel electrode 12, the same material as the conductive member forming the wiring or the conductive member forming pad electrodes for connection to the outside can be used. For example, for the pixel electrodes 12, a material such as Al, Cu, or TiN can appropriately be used. Such a configuration allows the pixel electrode 12 to be formed simultaneously with the conductive member forming the wiring in the wiring layer 11 or with the pad electrodes. Therefore, it is possible to simplify the manufacturing process.

The light blocking film 8 may be formed of any material as long as the material blocks light. For the light blocking film 8, in the same manner as for the wiring, a metal material such as copper, aluminum, tungsten, tantalum, titanium, or an alloy thereof can be used appropriately.

The color filters 14 are filters that transmit any of light beams R, G, and B or any of light beams C, M, and Y. The color filters 14 may also be white filters that transmit light beams at RGB or CMY wavelengths or IR filters. Note that, when level differences are produced between the color filters as a result of providing the color filters 14 of a plurality of types, a planarization layer may also be provided over the color filters 14.

The microlenses 15 are formed using a material such as a resin. Note that it may also be possible to define a region where, e.g., one microlens 15 is provided as one pixel.

Note that the color filters 14 and the microlenses 15 may be disposed not only in the pixel region 3, but also in the peripheral region. For example, as illustrated in FIG. 2, in an area of the peripheral region adjacent to the pixel region 3, color filters 14' and microlenses 15' may also be disposed over the conductive layer 4 and the photoelectric conversion film 6. As a result, the color filters and the microlenses are disposed to extend from the pixel region 3 to the peripheral region, and consequently it is possible to improve uniformities of the color filters 14 and the microlenses 15 which are disposed in the pixel region 3. In other words, it is possible to improve a yield in the imaging device 1 and improve a light blocking property in the light blocking pixel region 31.

Second Embodiment

A description will be given below of the imaging device 1 according to the second embodiment. Note that a description of the same components as those of the first embodiment is omitted.

Figure 9:
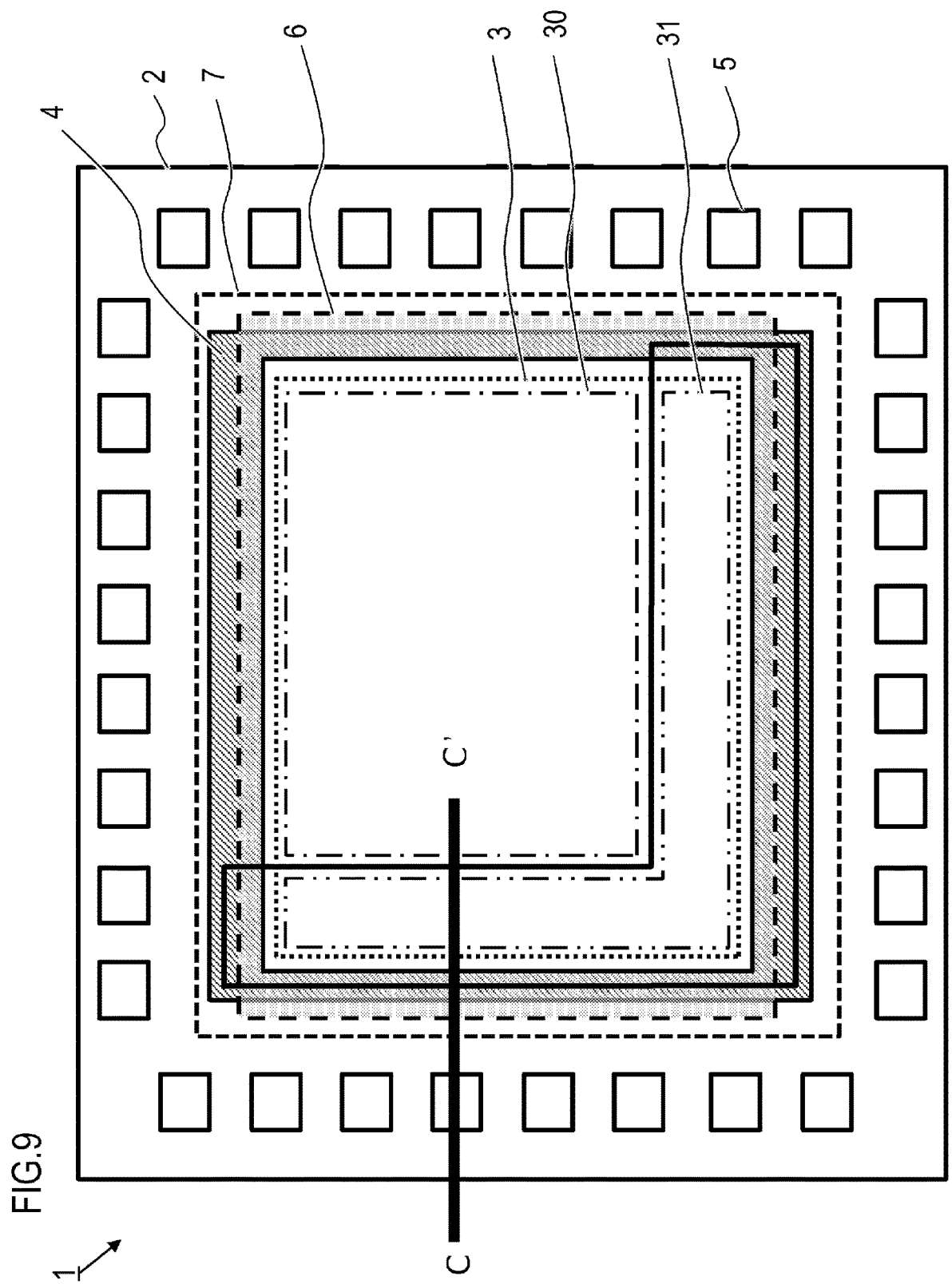
FIG. 9 is a plan view of an imaging device according to a second embodiment.
Figure 10:
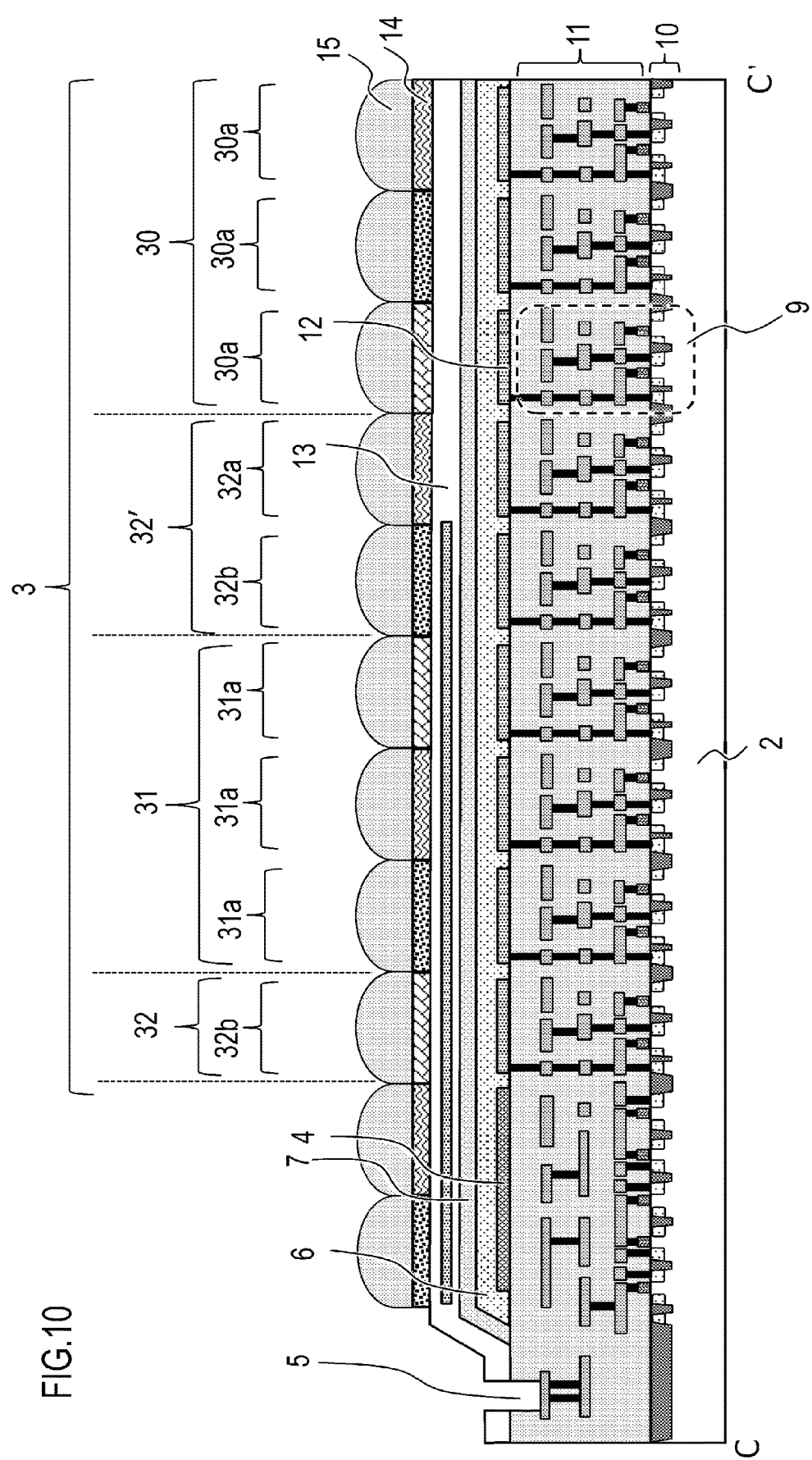
FIG. 10 is a cross-sectional view of the imaging device according to the second embodiment along a line C-C.

FIG. 9 is a plan view obtained by viewing the imaging device 1 according to the second embodiment from above. FIG. 10 is a cross-sectional view of the imaging device 1 illustrated in FIG. 9 along a line C-C'. In the imaging device 1 according to the second embodiment, in the same manner as in the imaging device 1 according to the first embodiment, the conductive layer 4 is disposed so as to surround the pixel region 3 in plan view, and the photoelectric conversion film 6 extends over the conductive layer 4 and in the pixel region 3.

Meanwhile, as illustrated in FIGS. 9 and 10, unlike in the first embodiment, the imaging device 1 includes the conductive layer 4 having a rectangular frame shape having sides along which the conductive layer 4 and the upper electrode 7 are electrically connected and sides along which the conductive layer 4 and the upper electrode 7 are not electrically connected. More specifically, as illustrated in FIG. 10, along the left and right sides (in a cross section along the line C-C'), the photoelectric conversion film 6 is disposed over the conductive layer 4 and the upper electrode 7 is disposed on the photoelectric conversion film 6, but the upper electrode 7 and the conductive layer 4 are not in contact with each other.

Thus, in the second embodiment, along each of the two sides of the conductive layer 4, there is no region where the conductive layer 4 and the upper electrode 7 are electrically connected, which allows the size of the imaging device 1 to be accordingly reduced. Note that the region where the conductive layer 4 and the upper electrode 7 are electrically connected is present along each of the two sides, but is not limited thereto. The region where the conductive layer 4 and the upper electrode 7 are electrically connected may be present along one side or each of three sides.

Third Embodiment

A description will be given below of the imaging device 1 according to the third embodiment. Note that a description of the same components as those of the first embodiment is omitted. Similarly to the imaging device 1 according to the first embodiment, the imaging device 1 according to the third embodiment is illustrated by a plan view as illustrated in FIG. 1.

Figure 11:
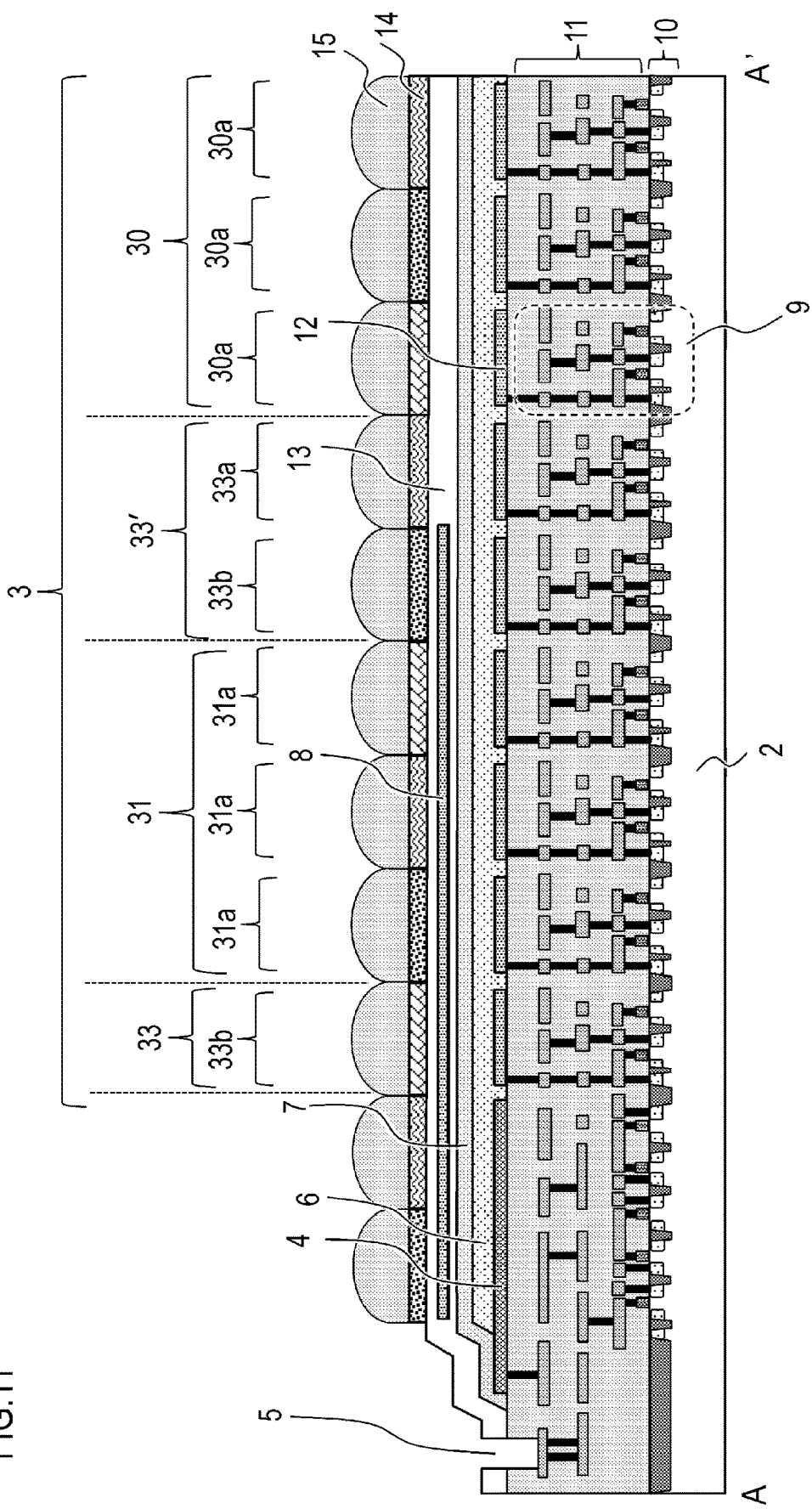
FIG. 11 is a cross-sectional view of an imaging device according to a third embodiment along a line A-A'.

FIG. 11 is a cross-sectional view of the imaging device 1 according to the third embodiment along a line A-A' in FIG. 1. In the imaging device 1, in the same manner as in the first embodiment, the conductive layer 4 is disposed so as to surround the pixel region 3, and the photoelectric conversion film 6 extends over the conductive layer 4 and in the pixel region 3.

In the imaging device 1 according to the third embodiment, instead of the dummy pixel region 32 in the first embodiment, a buffer pixel region 33 is disposed and, instead of the dummy pixel region 32', a buffer pixel region 33' is disposed.

The buffer pixel region 33 is disposed adjacent to an end portion of the pixel region 3 and to the light blocking pixel region 31 and has buffer light blocking pixels 33b. The buffer pixel region 33' is disposed between the effective pixel region 30 and the light blocking pixel region 31 and has buffer pixels 33a and the buffer light blocking pixels 33b. Each of the buffer pixels 33a does not have the light blocking film 8, while each of the buffer light blocking pixels 33b has the light blocking film 8.

The buffer pixels 33a are disposed adjacent to the effective pixel region 30. The buffer light blocking pixels 33b are disposed adjacent to the light blocking pixel region 31. In other words, the buffer pixels 33a are arranged so as to surround the effective pixel region 30, while the buffer light blocking pixels 33b are arranged so as to surround the light blocking pixel region 31. This allows, in the same manner as in the first embodiment, a sufficient amount of light to be incident on the photoelectric conversion film 6 in the effective pixel region 30 and allows an amount of the light incident on the photoelectric conversion film 6 in the light blocking pixel region 31 to be sufficiently reduced.

Note that, in the example illustrated in FIG. 11, the buffer pixels 33a surrounding the effective pixel region 30 and the buffer light blocking pixels 33b surrounding the light blocking pixel region 31 are equivalent to one pixel, but the buffer pixels 33a and the buffer light blocking pixels 33b which are at least two pixels may also be provided.

In each of the buffer pixels 33a and the buffer light blocking pixels 33b, a given voltage is applied to the pixel electrode 12 so as to allow the pixel electrode 12 to collect charges. Each of FIG. 12A, FIG. 12B, and FIG. 13 illustrates an example of a configuration of the pixel circuit 9 of each of the buffer pixels 33a and the buffer light blocking pixels 33b.

Figure 12A:
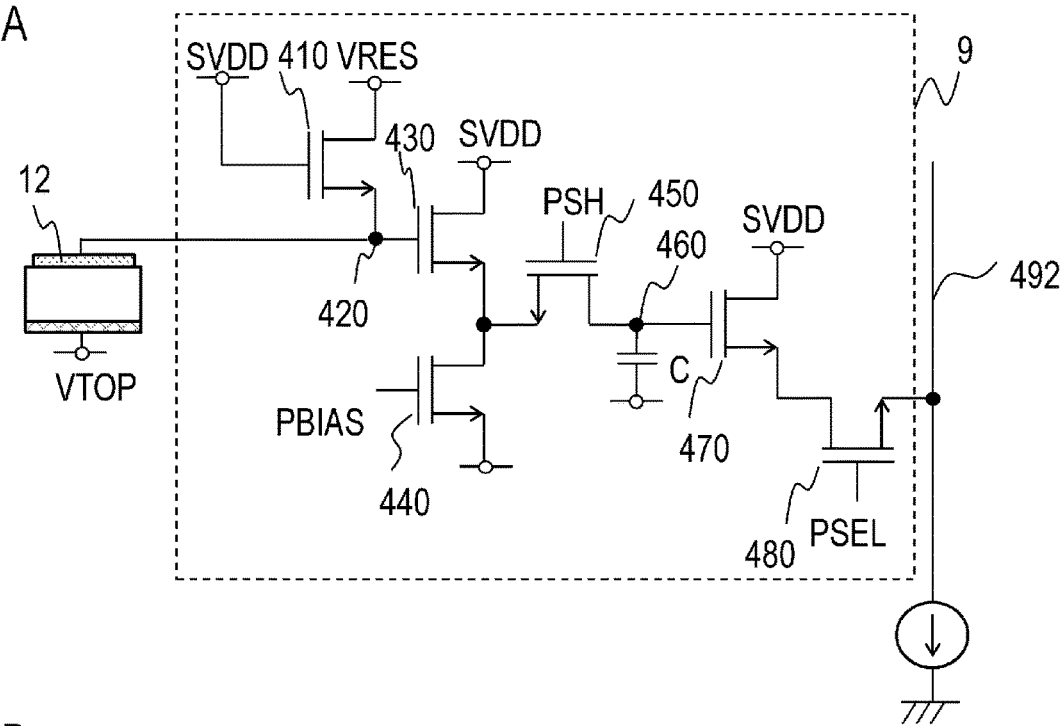
FIGS. 12A and 12B are circuit diagrams of a pixel circuit according to the third embodiment.

In the configuration of the pixel circuit 9 illustrated in FIG. 12A which is obtained by modifying the circuit illustrated in FIG. 7A, the reset transistor 410 is constantly kept ON. For example, by connecting the gate of the reset transistor 410 to the reference potential SVDD, a H level signal is constantly input to the reset transistor 410. Thus, the reset potential VRES is constantly written in the FD 420.

Figure 12B:
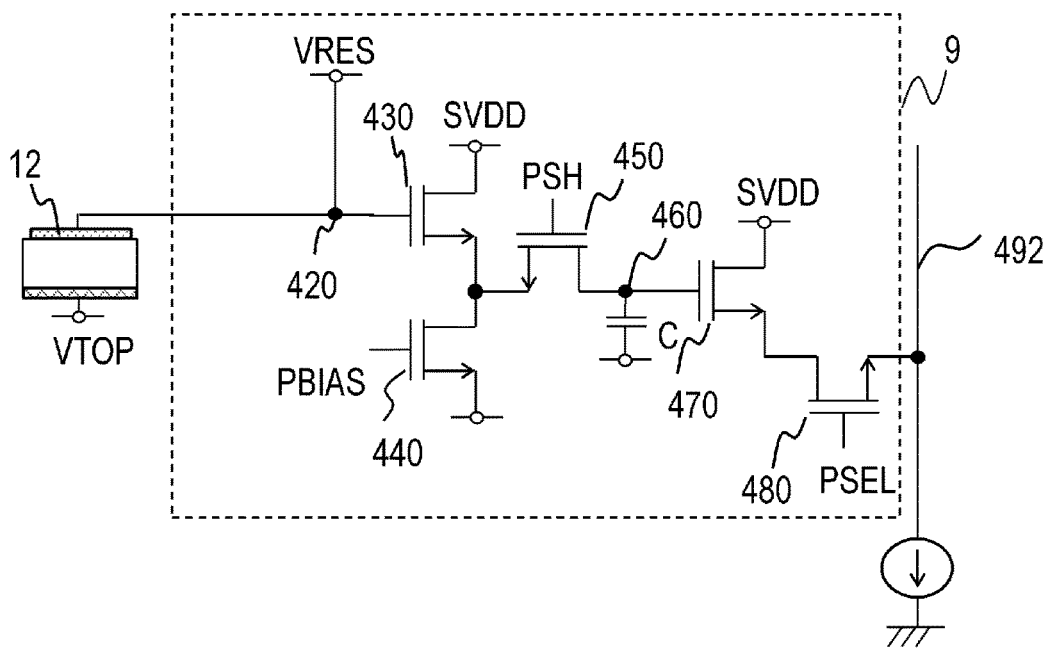

In the configuration of the pixel circuit 9 illustrated in FIG. 12B which is obtained by modifying the circuit illustrated in FIG. 7A, the reset transistor 410 is not provided, and the reset potential VRES is electrically connected to the FD 420.

Figure 13:
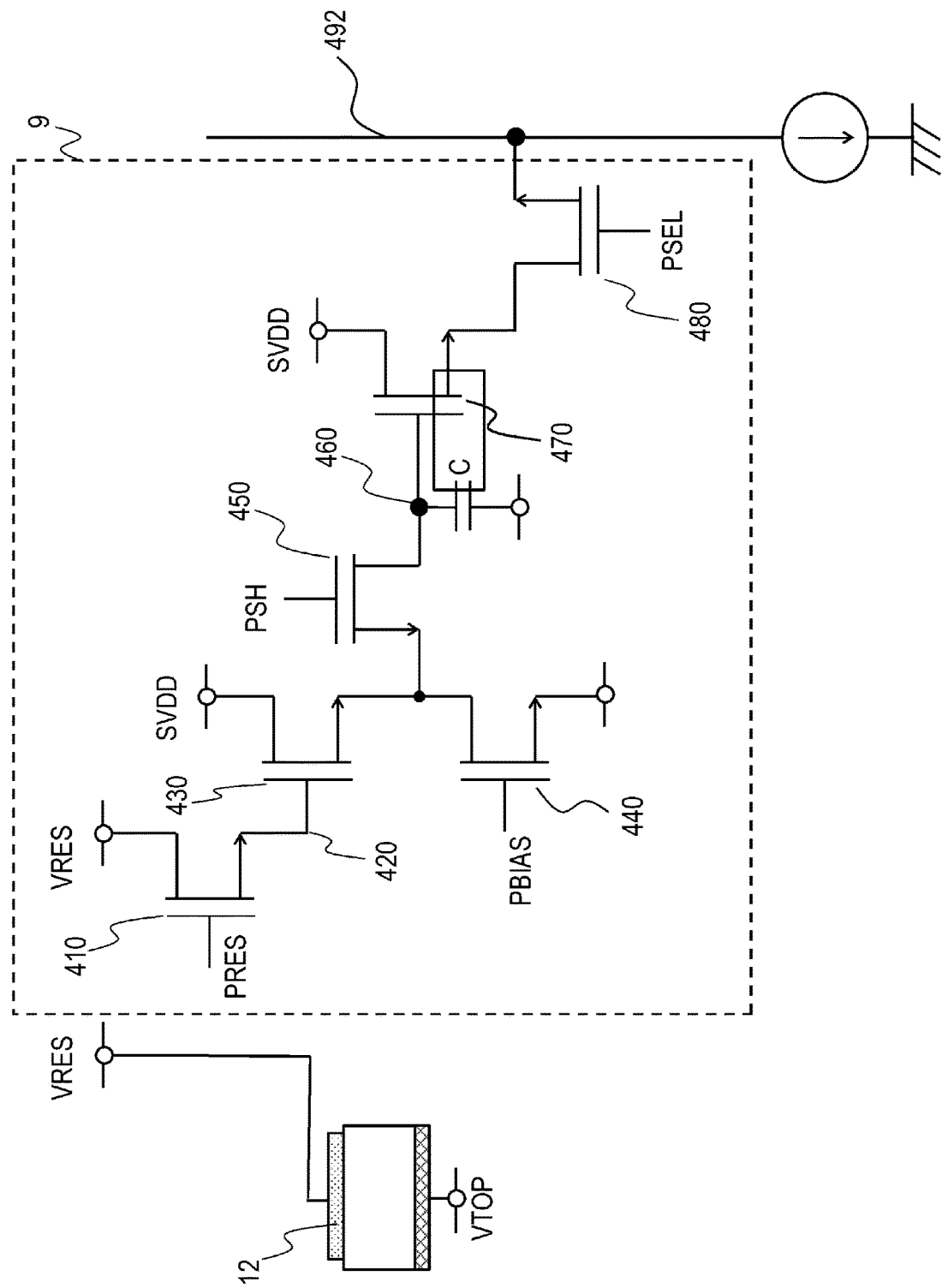
FIG. 13 is a circuit diagram of the pixel circuit according to the third embodiment.

In the configuration illustrated in FIG. 13, the pixel circuit 9 and the pixel electrode 12 are not connected, and the reset potential VRES is electrically connected to the pixel electrode 12.

According to the third embodiment, in each of the buffer pixels 33a and the buffer light blocking pixels 33b, it is possible to provide a state where the reset potential VRES is constantly connected to the pixel electrode 12 and consequently allow the pixel electrode 12 to collect the charges generated in the photoelectric conversion film 6. This can reduce a possibility that unneeded charges move into the effective pixel region 30 or the light blocking pixel region 31. Therefore, it is possible to prevent image quality degradation.

Note that each of the buffer pixels 33a and the buffer light blocking pixels 33b is not limited to the configuration having the pixel circuit 9 described above. The configuration of each of the buffer pixels 33*a* and the buffer light blocking pixels 33*b* may be any as long as the pixel electrode 12 can collect the charges generated in the photoelectric conversion film 6 in each of the buffer pixels 33*a* and the buffer light blocking pixels 33*b*.

Fourth Embodiment

A description will be given below of the imaging device 1 according to the fourth embodiment. Note that a description of the same components as those of the first embodiment is omitted.

Figure 15:
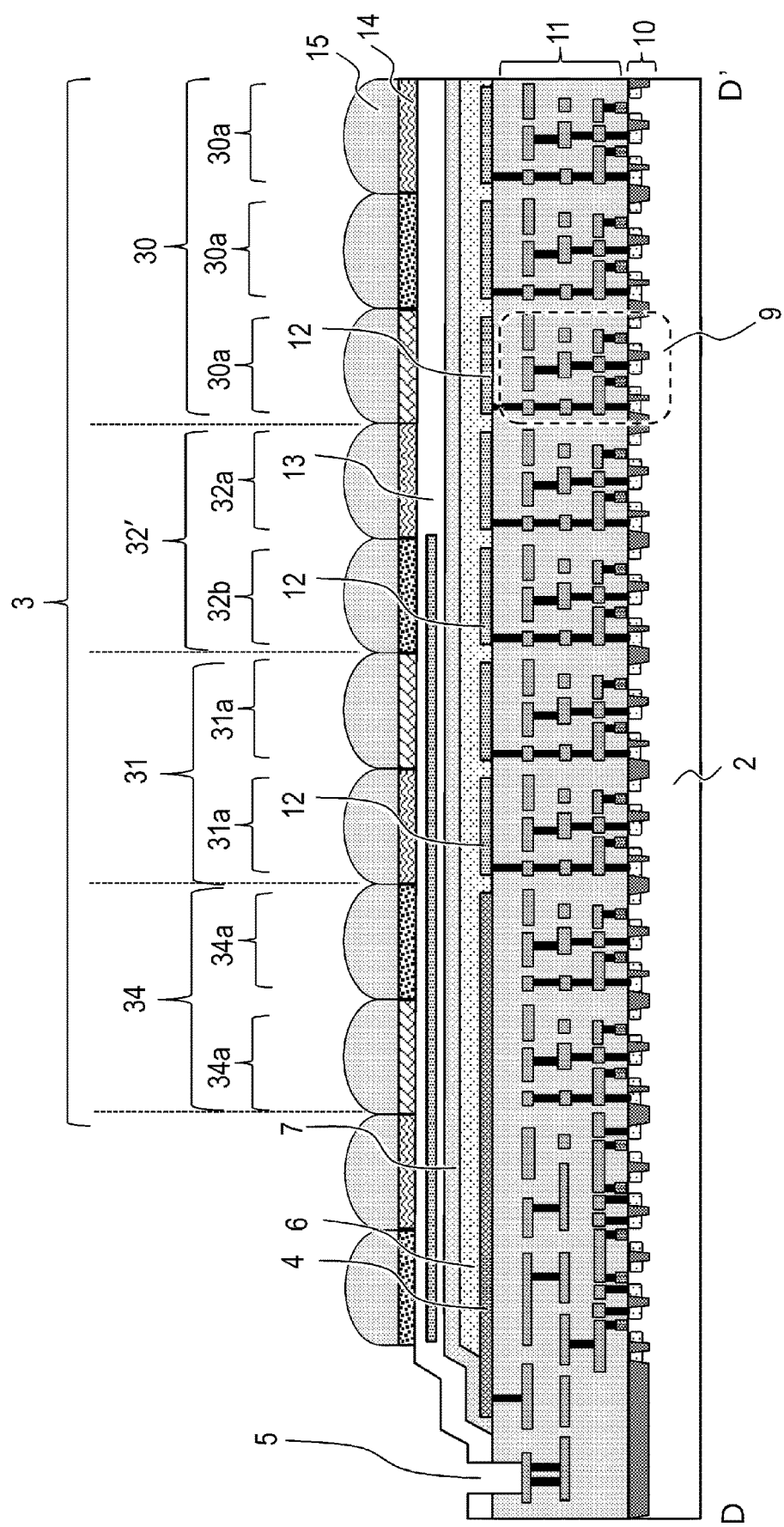
FIG. 15 is a cross-sectional view of the imaging device according to the fourth embodiment along a line D-D'.

FIG. 14A is a plan view obtained by viewing the imaging device 1 according to the fourth embodiment from above. FIG. 15 is a cross-sectional view of the imaging device 1 illustrated in FIG. 14A along a line D-D'. In the fourth embodiment also, in the imaging device 1, the conductive layer 4 is disposed so as to surround the pixel region 3. However, unlike in the first embodiment, the conductive layer 4 extends to a point inside the pixel region 3.

As illustrated in FIG. 15, in the pixel region 3, the effective pixel region 30, the light blocking pixel region 31, the dummy pixel region 32', and a NULL pixel region 34 are disposed. Each of the effective pixel region 30, the light blocking pixel region 31, and the dummy pixel region 32' is configured in the same as in the first embodiment.

The NULL pixel region 34 is disposed at an end portion of the pixel region 3. In the NULL pixel region 34, the conductive layer 4 electrically connected to the upper electrode 7 is disposed. The NULL pixel region 34 is also disposed adjacent to the light blocking pixel region 31. The NULL pixel region 34 has NULL pixels 34*a*. Each of the NULL pixels 34*a* may also include the light blocking film 8. Note that the conductive layer 4 and the upper electrode 7 in the NULL pixel region 34 need not be electrically connected, and may appropriately be at the same potential.

Note that the NULL pixel region 34 corresponds to a region where the pixel region 3 and the conductive layer 4 overlap each other in the plan view illustrated in FIG. 14A. Note that the pixel circuit 9 in each of the NULL pixels 34*a* has the same configuration as that of the pixel circuit 9 in the effective pixel region 30, but is not connected to the pixel electrode 12 and does not read signal charges from the photoelectric conversion film 6.

Note that, instead of the dummy pixel region 32', the buffer pixel region 33' (the buffer pixels 33*a* and the buffer light blocking pixels 33*b*) may also be disposed as in the third embodiment.

Figure 16:
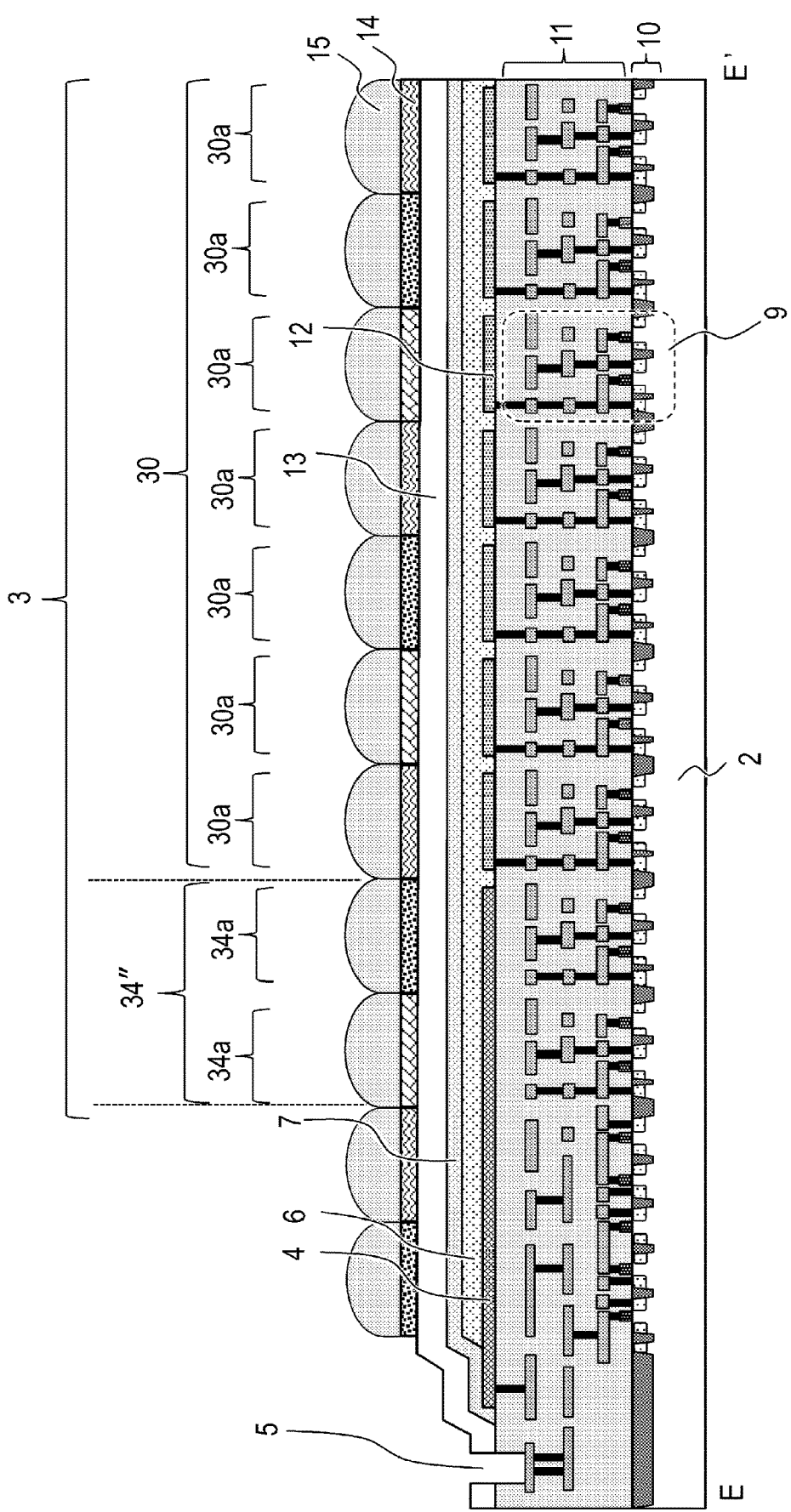
FIG. 16 is a cross-sectional view of the imaging device according to the fourth embodiment along a line E-E'.

FIG. 16 is a cross-sectional view of the imaging device 1 illustrated in FIG. 14A along a line E-E'. In the cross section, unlike in FIG. 15, the light blocking pixel region 31 is not disposed. At an end portion of the pixel region 3, a NULL pixel region 34" is disposed. The NULL pixel region 34" has the NULL pixels 34*a*. The NULL pixel region 34" is disposed adjacent to the effective pixel region 30.

Thus, in the photoelectric conversion film 6 interposed between the conductive layer 4 and the upper electrode 7 in each of the NULL pixels 34*a*, the applied voltage is zero. Accordingly, even when electrons are generated, the electrons are immediately recombined with holes, and consequently a dark current and a photocurrent are scarcely generated. As a result, there is no movement of unneeded charges into the effective pixel region 30, and it is possible to prevent image quality degradation.

Fifth Embodiment

A description will be given below of the imaging device 1 according to the fifth embodiment. Note that a description of the same components as those of the fourth embodiment is omitted.

Figure 17:
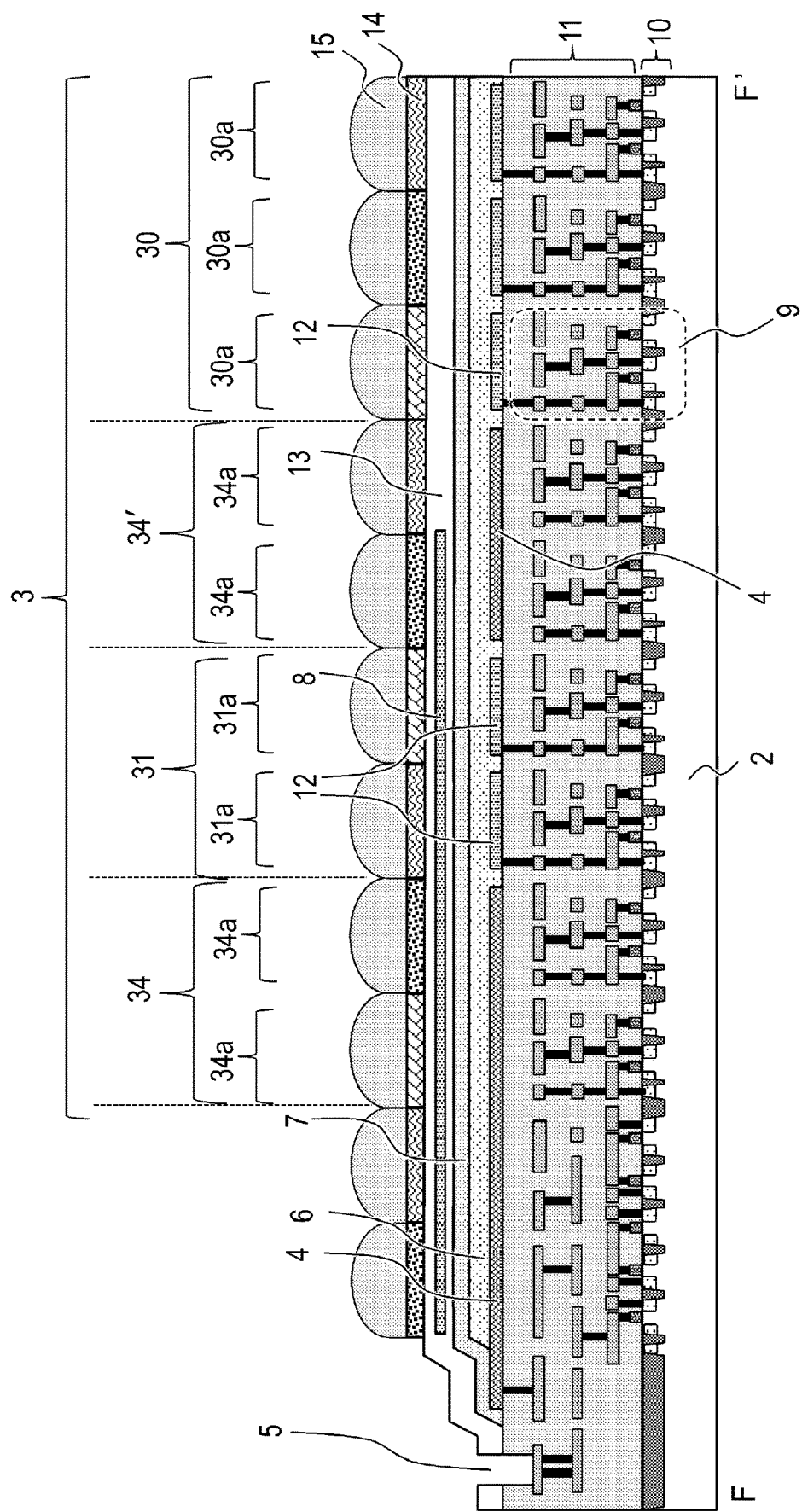
FIG. 17 is a cross-sectional view of the imaging device according to the fifth embodiment along a line F-F'.

FIG. 14B is a plan view obtained by viewing the imaging device 1 according to the fifth embodiment from above. FIG. 17 is a cross-sectional view of the imaging device 1 illustrated in FIG. 14B along a line F-F'. In the imaging device 1, the conductive layer 4 is disposed so as to surround the pixel region 3. In the same manner as in the fourth embodiment, the conductive layer 4 extends to a point inside the pixel region 3. Note that, unlike in the third embodiment, the conductive layer 4 is disposed to surround not only an end portion of the pixel region 3, but also the light blocking pixel region 31 in plan view.

As illustrated in FIG. 17, the pixel region 3 includes the effective pixel region 30, the light blocking pixel region 31, the NULL pixel region 34, and the NULL pixel region 34'. Each of the effective pixel region 30, the light blocking pixel region 31, and the NULL pixel region 34 has the same configuration as that in the fourth embodiment.

The NULL pixel region 34' is disposed between the effective pixel region 30 and the light blocking pixel region 31. The conductive layer 4 electrically connected to the upper electrode 7 is included in the NULL pixel region 34'. The NULL pixel region 34 and the NULL pixel region 34' are disposed adjacent to the light blocking pixel region 31. The NULL pixel region 34 and the NULL pixel region 34' have the NULL pixels 34*a*. Each of the NULL pixels 34*a* may also include the light blocking film 8.

Note that the NULL pixel region 34 and the NULL pixel region 34' correspond to an area of the pixel region 3 which is covered with the conductive layer 4 in FIG. 14B.

Note that, between the effective pixels 30*a* and the NULL pixels 34*a*, the dummy pixels 32*a* may also be disposed, though not shown. Also, between the light blocking pixels 31*a* and the NULL pixels 34*a*, the dummy light blocking pixels 31*b* may also be disposed.

In the same manner as in the fourth embodiment, in the photoelectric conversion film 6 interposed between the conductive layer 4 and the upper electrode 7 in each of the NULL pixels 34*a*, the applied voltage is zero. Accordingly, even when electrons are generated, the electrons are immediately recombined with holes, and consequently a dark current and a photocurrent are scarcely generated. As a result, there is no movement of unneeded charges into the effective pixel region 30 or the light blocking pixel region 31, and it is possible to prevent image quality degradation.

Sixth Embodiment

A description will be given below of the imaging device 1 according to the sixth embodiment. Note that a description of the same components as those of the first embodiment is omitted. Similarly to the imaging device 1 according to the first embodiment, the imaging device 1 according to the sixth embodiment is illustrated by a plan view as illustrated in FIG. 1.

Figure 18:
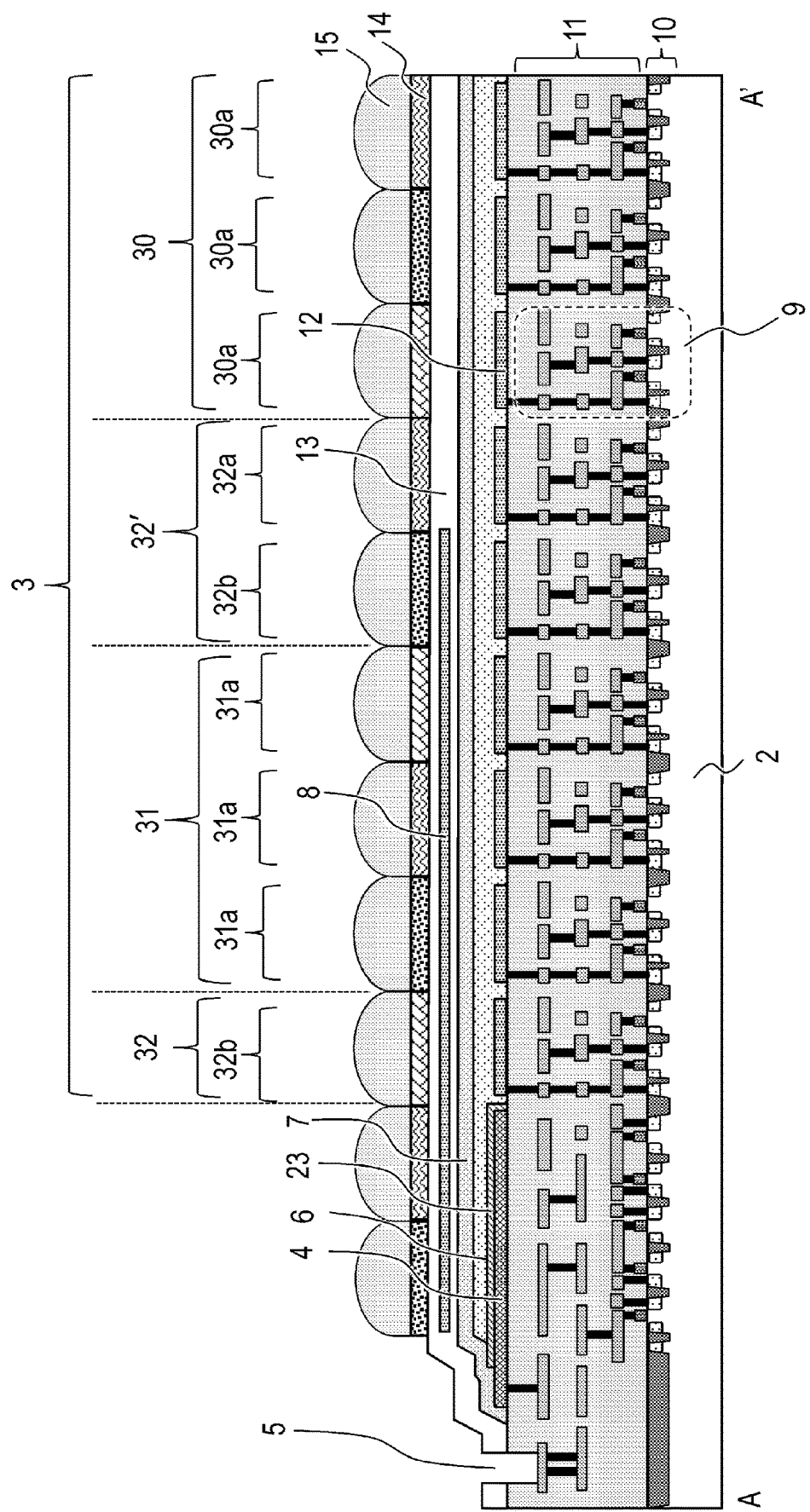
FIG. 18 is a cross-sectional view of an imaging device according to a sixth embodiment along a line A-A'.

FIG. 18 is a cross-sectional view of the imaging device 1 according to the sixth embodiment along a line A-A' in FIG. 1. Unlike in the first embodiment, in the peripheral region (region where the photoelectric conversion film 6 is interposed between the upper electrode 7 and the conductive layer 4), between the conductive layer 4 and the photoelectric conversion film 6, an insulating layer 23 is disposed. In other words, in the peripheral region, there is an area where the conductive layer 4, the insulating layer 23, the photoelectric conversion film 6, and the upper electrodes 7 are stacked in this order. For the insulating layer 23, for example, silicon dioxide, BPSG, PSG, BSG, silicon nitride, or silicon carbide can be used. When a thickness of the insulating layer 21 is preferably 10 nm to 300 nm, or more preferably 50 nm to 200 nm, the conductive layer 4 and the upper electrode 7 can effectively give a bias (voltage) to the photoelectric conversion film 6.

Note that, in the sixth embodiment, as illustrated in FIG. 8, the first functional layer 61 such as a charge blocking layer or an adhesion layer is interposed between the photoelectric conversion layer 60 and the pixel electrode 12. When the first functional layer 61 has a low resistance in the configuration in the first embodiment, a current may flow from the conductive layer 4 into the pixel electrode 12 in the effective pixel region 30 or the light blocking pixel region 31 via the first functional layer 61 to possibly cause image quality degradation. By contrast, by disposing the insulating layer 23 as in the sixth embodiment, it is possible to prevent a current from flowing via the first functional layer 61 and prevent the image quality degradation.

Seventh Embodiment

Figure 19:
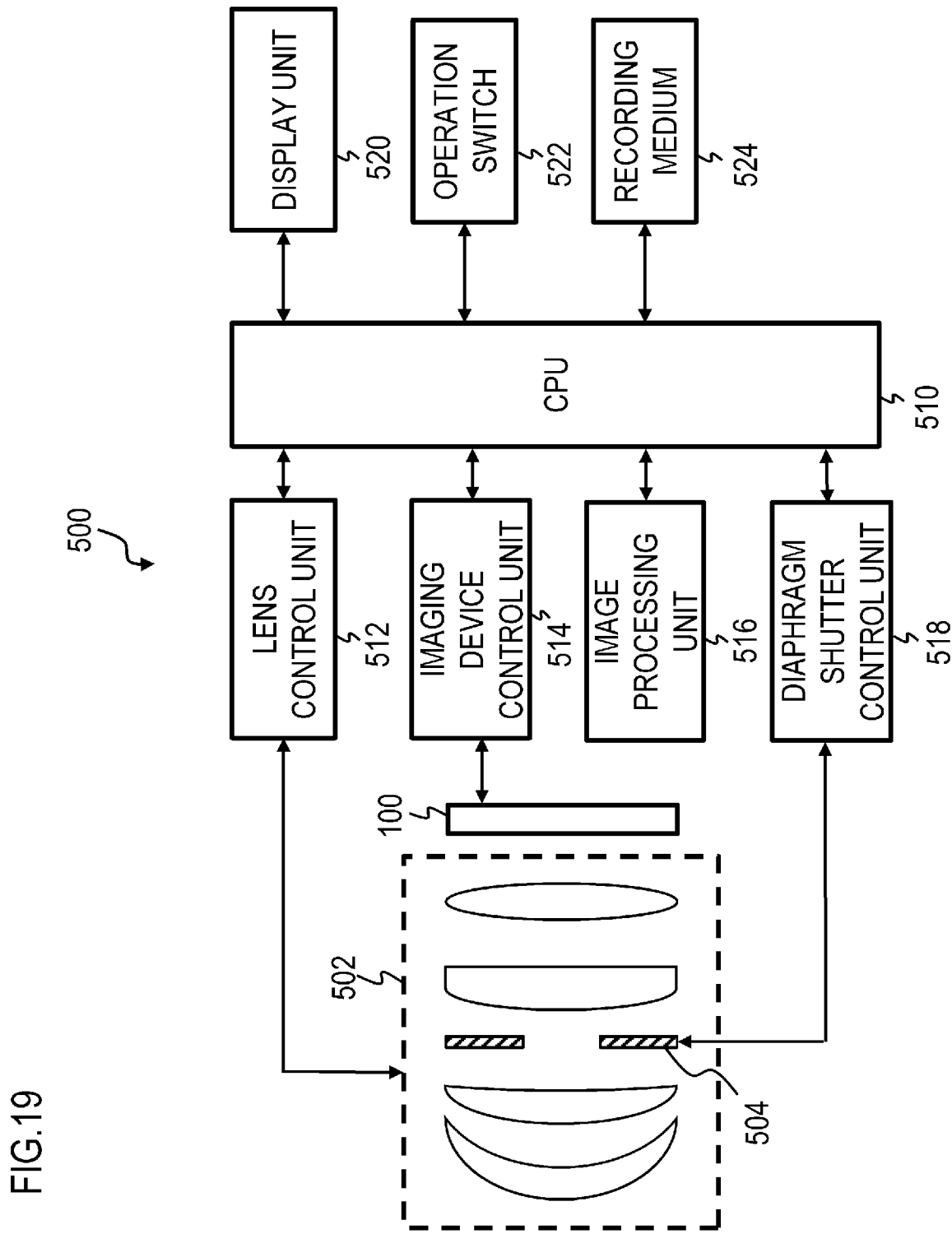
FIG. 19 is a diagram illustrating an example of a configuration of an imaging system according to a seventh embodiment.

Referring to FIG. 19, a description will be given below of an imaging system according to the seventh embodiment. FIG. 19 is a block diagram illustrating a schematic configuration of the imaging system according to the seventh embodiment.

The imaging devices 1 (photoelectric conversion devices) described above in the first to sixth embodiments are applicable to various imaging systems. The imaging systems to which the imaging devices 1 are applicable are not particularly limited, and examples thereof include various devices such as a digital still camera, a digital camcorder, a monitoring camera, a copier, a fax, a mobile phone, an in-vehicle camera, an observation satellite, and a medical camera. In addition, a camera module including an optical system such as lenses and the photoelectric conversion device is also included in the imaging systems. By way of example, FIG. 19 illustrates a block diagram of the digital still camera as an example of the imaging systems.

An imaging system 500 includes a photoelectric conversion device 100, an imaging optical system 502, a CPU 510, a lens control unit 512, an imaging device control unit 514, an image processing unit 516, a diaphragm shutter control unit 518, a display unit 520, operation switches 522, and a recording medium 524 each illustrated in FIG. 19.

The imaging optical system 502 is an optical system for forming an optical image of a subject to be imaged, and includes a lens group, a diaphragm 504, and the like. The diaphragm 504 has not only the function of adjusting an aperture diameter thereof to adjust an amount of light during imaging, but also the function of an exposure second time adjustment shutter during imaging of a still image. The lens group and the diaphragm 504 are held to be forwardly and backwardly movable along an optical axis direction, and associated operations thereof implement a variable magnification function (zoom function) and a focal point adjustment function. The imaging optical system 502 may be integrated with the imaging system or may also be an imaging lens attachable to the imaging system.

In an image space of the imaging optical system 502, the photoelectric conversion device 100 is disposed such that an imaging surface thereof is located in the image space. The photoelectric conversion device 100 is the imaging device 1 described in each of the first to sixth embodiments, and is configured to include a CMOS sensor (pixel portion) and a peripheral circuit (peripheral circuit region) therearound. In the photoelectric conversion device 100, a plurality of pixels each having a photoelectric conversion portion are two-dimensionally arranged, and color filters are disposed for these pixels to form a two-dimensional single-plate color sensor. The photoelectric conversion device 100 performs photoelectric conversion of an image of the subject to be imaged which is formed by the imaging optical system 502 and outputs a resulting image as an image signal or a focal point detection signal.

The lens control unit 512 is intended to control forward/backward driving of the lens group of the imaging optical system 502 to perform a variable magnification operation and focal adjustment, and includes a circuit and a processing device which are configured to perform the functions. The diaphragm shutter control unit 518 is intended to change the aperture diameter (vary an aperture value) of the diaphragm 504 to adjust an amount of photographing light, and includes a circuit and a processing device which are configured to perform the functions.

The CPU 510 is a control device in the camera which is responsible for various control of a camera main body and includes an arithmetic unit, a ROM, a RAM, an A/D converter, a D/A converter, a communication interface circuit, and the like. The CPU 510 controls operations of individual components of the camera based on a computer program stored in the ROM or the like to implement a sequence of imaging operations such as AF including detection of a focal state (focal point detection) of the imaging optical system 502, imaging, image processing, and recording. The CPU 510 serves also as a signal processing unit.

The imaging device control unit 514 is intended to control an operation of the photoelectric conversion device 100 and also perform A/D conversion of a signal output from the photoelectric conversion device 100 to transmit a resulting signal to the CPU 510, and includes a circuit and a control device which are configured to implement the functions. The A/D conversion function may also be provided in the photoelectric conversion device 100. The image processing unit 516 is intended to perform image processing such as y conversion or color interpolation on the signal resulting from the A/D conversion to generate an image signal, and includes a circuit and a control device which are configured to perform the functions. The display unit 520 is a display device such as a liquid crystal display device (LCD), and displays information related to a photographing mode of the camera, a preview image before photographing, a confirmation image after the photographing, a focused state when a focal point is detected, and the like. The operation switches 522 include a power source switch, a release (photographing trigger) switch, a zoom operation switch, a photographing mode selection switch, and the like. The recording medium 524 is intended to record a photographed image and the like, and may be either a recording medium embedded in the imaging system or a detachable recording medium such as a memory card.

By thus forming the imaging system 500 to which the imaging device 1 (photoelectric conversion device) according to any of the first to sixth embodiments is applied, it is possible to implement a high-performance imaging system.

Eighth Embodiment

Figure 20A:
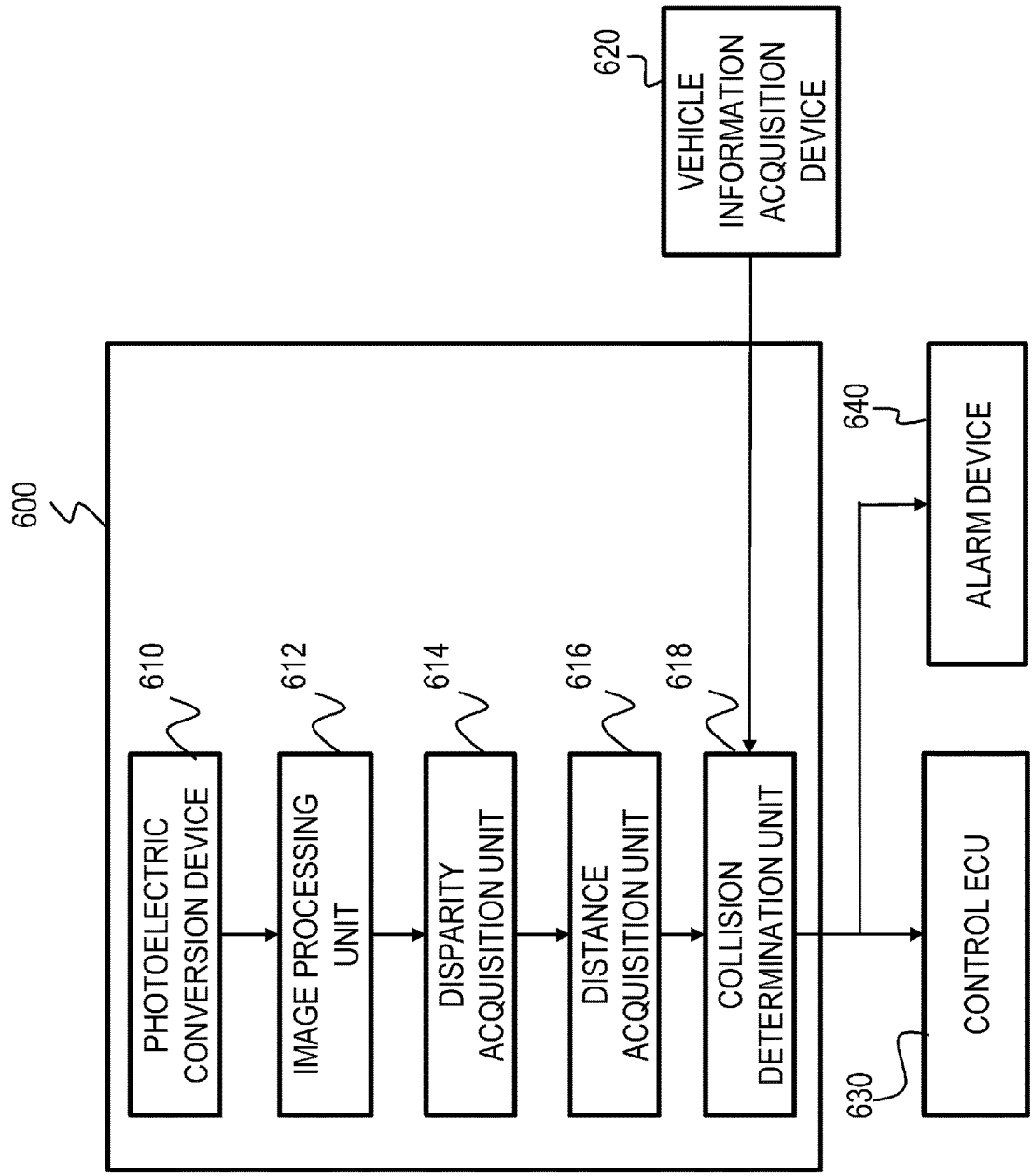
FIG. 20A is a diagram illustrating an imaging system according to an eighth embodiment.
Figure 20B:
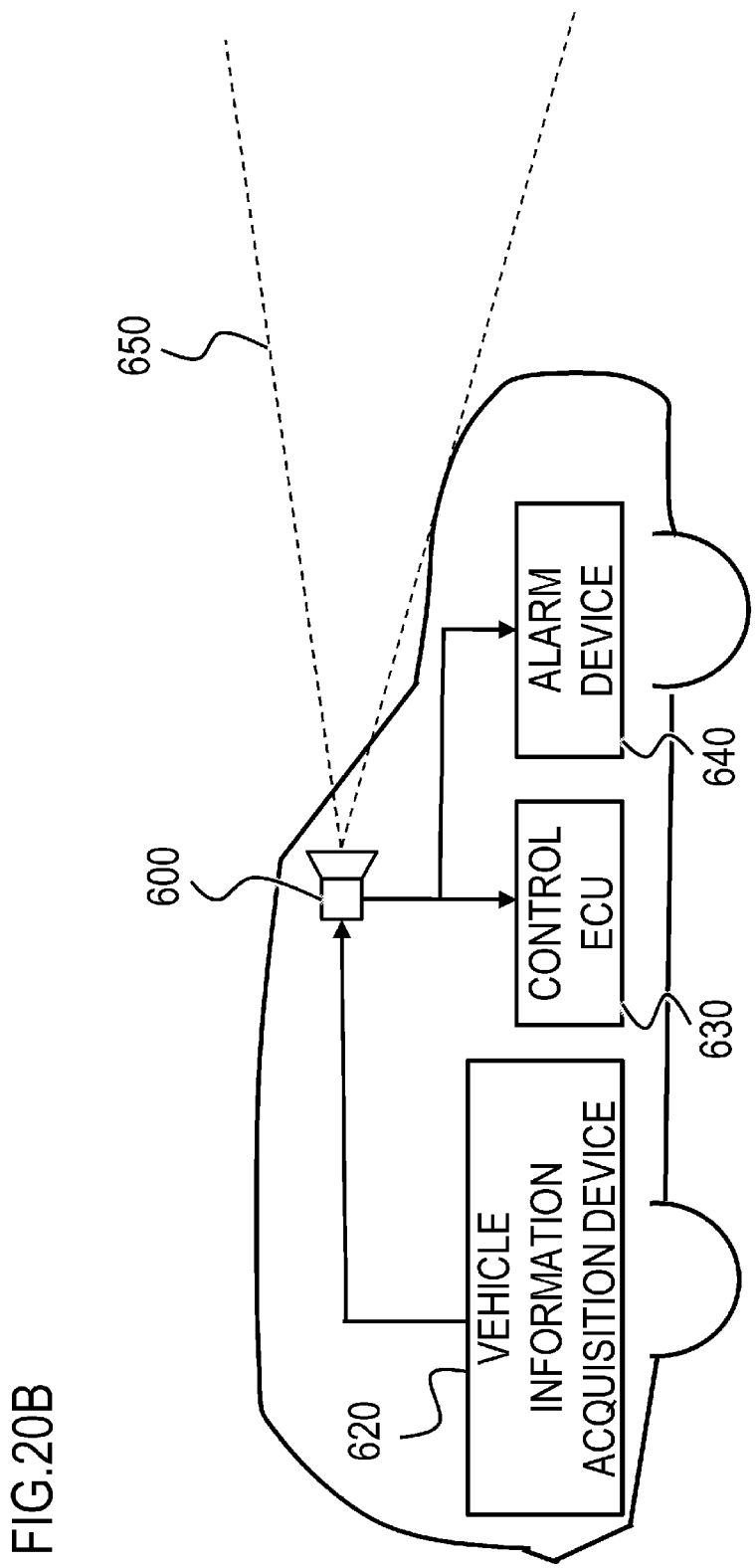
FIG. 20B is a diagram illustrating an example of a configuration of a moving body according to the eighth embodiment.

Referring to FIGS. 20A and 20B, a description will be given of an imaging system and a moving body according to the eighth embodiment of the present technique. FIGS. 20A and 20B are diagrams each illustrating a configuration of the imaging system and the moving body according to the eighth embodiment.

FIG. 20A illustrates an example of an imaging system 600 related to an in-vehicle camera. The imaging system 600 includes a photoelectric conversion device 610. The photoelectric conversion device 610 is any one of the imaging devices 1 (photoelectric conversion devices) described above in the first to sixth embodiments. The imaging system 600 includes an image processing unit 612 serving a processing device that performs image processing on a plurality of image data sets acquired by the photoelectric conversion device 610. The imaging system 600 includes a disparity acquisition unit 614 serving as a processing device that performs calculation of a disparity (a phase difference between disparity images) from the plurality of image data sets acquired by the photoelectric conversion device 610. The imaging system 600 also includes a distance acquisition unit 616 serving as a processing device that calculates a distance to a subject to be imaged based on the calculated disparity and a collision determination unit 618 serving as a processing device that determines whether or not there is a possibility of a collision based on the calculated distance. Each of the disparity acquisition unit 614 and the distance acquisition unit 616 mentioned herein is an example of an information acquisition means that acquires information such as distance information sets each representing the distance to the subject. In other words, the distance information sets are information sets related to the disparity, an amount of defocusing, the distance to the subject, and the like. The collision determination unit 618 may also determine the possibility of a collision by using any of the distance information sets. Each of the various processing devices described above may be implemented by hardware designed for a dedicated use or may also be implemented by versatile hardware which performs an arithmetic operation based on a software module. Each of the processing devices may also be implemented by a FPGA (Field Programmable Gate Array), an ASIC (Application Specific Integrated Circuit), or the like or a combination thereof.

The imaging system 600 is connected to a vehicle information acquisition device 620 to be able to acquire vehicle information such as a vehicle speed, a yaw rate, and a steering angle. The imaging system 600 is also connected to a control ECU 630 serving as a control device that outputs a control signal for generating a braking force on a vehicle based on a result of the determination by the collision determination unit 618. In other words, the control ECU 630 is an example of a moving body control means that controls a moving body based on the distance information sets. The imaging system 600 is also connected to an alarm device 640 that generates an alarm to a driver based on the result of the determination by the collision determination unit 618. For example, when the possibility of a collision is high as a result of the determination by the collision determination unit 618, the control ECU 630 performs vehicle control to avoid a collision or reduce damage by braking, easing off an accelerator pedal, or reducing an engine output. The alarm device 640 warns a user through generation of an alarm such as a sound, displaying of alarm information on a screen of a car navigation system or the like, giving of vibration to a seat belt or a steering wheel, or the like.

In the eighth embodiment, the imaging system 600 images a scene around the vehicle, e.g., a scene ahead of or behind the vehicle. FIG. 20B illustrates the imaging system 600 when the scene ahead of the vehicle (imaging range 650) is imaged. The vehicle information acquisition device 620 transmits an instruction to cause the imaging system 600 to operate and perform imaging. By using the imaging device 1 (photoelectric conversion device) according to any of the first to sixth embodiments described above as the photoelectric conversion device 610, the imaging system 600 in the eighth embodiment is allowed to have an improved distance measuring accuracy.

The foregoing has described the example of implementing control to avoid collision between a host vehicle and another vehicle. However, the imaging system is also applicable to control of causing the host vehicle to perform automated driving following another vehicle, control of causing the host vehicle to perform automated driving so as not to drift from a lane, or the like. In addition, applications of the imaging system are not limited to a vehicle such as an automobile. For example, the imaging system is also applicable to a moving body (transportation device) such as, e.g., a vessel, an aircraft, an industrial robot, or the like. Moving devices in the moving bodies (transportation devices) are various moving means such as an engine, a motor, wheels, and propellers. Moreover, the applications of the imaging system are not limited to the moving bodies, and the imaging system is also widely applicable to a device using object recognition such as an intelligent transportation system (ITS).

The technique can prevent image quality degradation and also reduce a possibility of a breakdown of a photoelectric conversion device.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-026133, filed on Feb. 19, 2020, which is hereby incorporated by reference herein in its entirety.

What is claimed is:

1. A photoelectric conversion device including (a) an effective pixel region including a plurality of effective pixels and (b) a peripheral region provided outside the effective pixel region, the photoelectric conversion device comprising:
a wiring layer;
an upper electrode; and
a photoelectric conversion film provided extensively over the effective pixel region and the peripheral region,
wherein each of the plurality of effective pixels includes a pixel electrode disposed between the wiring layer and the photoelectric conversion film in a depth direction,
wherein the peripheral region includes a conductive layer disposed between the wiring layer and the photoelectric conversion film in the depth direction, and
wherein the upper electrode and the conductive layer are at a same potential.

2. The photoelectric conversion device according to claim 1, wherein the upper electrode and the conductive layer are electrically connected to each other.

3. The photoelectric conversion device according to claim 1, wherein each of the conductive layer and the pixel electrode is disposed on the wiring layer.

4. The photoelectric conversion device according to claim 1, wherein the conductive layer and the pixel electrode are formed of a same material.

5. The photoelectric conversion device according to claim 1, further comprising a pad to which a bias is supplied from outside the photoelectric conversion device,
wherein the peripheral region is provided between the effective pixel region and the pad.

6. The photoelectric conversion device according to claim 1, further comprising a peripheral circuit on an opposite side of the wiring layer to the conductive layer,
wherein the conductive layer is disposed so as to block light directed to the peripheral circuit via the upper electrode.

7. The photoelectric conversion device according to claim 6, wherein the peripheral circuit includes a column signal processing circuit.

8. The photoelectric conversion device according to claim 6, wherein the peripheral circuit includes a column amplifier circuit.

9. The photoelectric conversion device according to claim 1, further comprising a color filter or a microlens in at least a portion of an area which includes the conductive layer of the peripheral region.

10. The photoelectric conversion device according to claim 1, wherein the conductive layer spreads into a rectangular frame shape, and
wherein four sides of the rectangular frame shape include at least (a) a side having a region where the conductive layer and the upper electrode are electrically connected to each other and (b) a side having a region where the conductive layer and the upper electrode are not electrically connected to each other.

11. The photoelectric conversion device according to claim 1, further comprising a light blocking pixel region including a light blocking pixel, which is a pixel where a light blocking film that blocks light directed to the photoelectric conversion film is disposed, and which has a pixel electrode disposed between the wiring layer and the photoelectric conversion film,
wherein the light blocking pixel region is disposed between the effective pixel region and the peripheral region.

12. The photoelectric conversion device according to claim 11, further comprising a second pixel region which is a region having the pixel electrode and in which a predetermined voltage is applied to the pixel electrode.

13. The photoelectric conversion device according to claim 11, further comprising a third pixel region between the effective pixel region and the light blocking pixel region, the third pixel region having the conductive layer.

14. The photoelectric conversion device according to claim 1, further comprising an insulating layer between the conductive layer and the photoelectric conversion film in a region where the photoelectric conversion film is interposed between the upper electrode and the conductive layer.

15. An imaging system comprising:
the photoelectric conversion device according to claim 1; and
a processing device that processes a signal output from the photoelectric conversion device.

16. A moving body comprising:
the photoelectric conversion device according to claim 1;
a moving device;
a processing device that acquires information from a signal output from the photoelectric conversion device; and
a control device that controls the moving device based on the information.

17. A photoelectric conversion device including (a) an effective pixel region including a plurality of effective pixels and (b) a peripheral region provided outside the effective pixel region, the photoelectric conversion device comprising:
a wiring layer;
an upper electrode; and
a photoelectric conversion film provided extensively over the effective pixel region and the peripheral region,
wherein each of the plurality of effective pixels includes a pixel electrode disposed between the wiring layer and the photoelectric conversion film in a depth direction,
wherein the peripheral region includes a conductive layer disposed between the wiring layer and the photoelectric conversion film in the depth direction, and
wherein the upper electrode and the conductive layer are connected to each other.

* * * * *